US 8,067,286 B2

(12) United States Patent
Parekh et al.

(10) Patent No.: US 8,067,286 B2
(45) Date of Patent: *Nov. 29, 2011

(54) METHODS OF FORMING RECESSED ACCESS DEVICES ASSOCIATED WITH SEMICONDUCTOR CONSTRUCTIONS

(75) Inventors: Kunal R. Parekh, Boise, ID (US); Suraj J. Mathew, Boise, ID (US); Jigish D. Trivedi, Boise, ID (US); John K. Zahurak, Boise, ID (US); Sanh D. Tang, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/012,675

(22) Filed: Jan. 24, 2011

(65) Prior Publication Data

US 2011/0117725 A1    May 19, 2011

Related U.S. Application Data

(63) Continuation of application No. 12/051,620, filed on Mar. 19, 2008, now Pat. No. 7,897,460, which is a continuation of application No. 11/090,529, filed on Mar. 25, 2005, now Pat. No. 7,384,849.

(51) Int. Cl.
*H01L 21/336* (2006.01)
(52) U.S. Cl. .................. 438/270; 257/E21.655
(58) Field of Classification Search .................. 438/270, 438/437, 589; 257/E21.419, E21.428, E21.655
See application file for complete search history.

(56) References Cited

U.S. PATENT DOCUMENTS

| | | |
|---|---|---|
| 4,455,740 A | 6/1984 | Iwai |
| 4,835,741 A | 5/1989 | Baglee |
| 4,922,460 A | 5/1990 | Furutani et al. |
| 4,931,409 A | 6/1990 | Nakajima et al. |
| 4,937,641 A | 6/1990 | Sunami et al. |
| 4,979,004 A | 12/1990 | Esquivel et al. |
| 5,013,680 A | 5/1991 | Lowrey et al. |
| 5,014,110 A | 5/1991 | Satoh |
| 5,021,355 A | 6/1991 | Dhong et al. |
| 5,047,117 A | 9/1991 | Roberts |
| 5,107,459 A | 4/1992 | Chu et al. |

(Continued)

FOREIGN PATENT DOCUMENTS

DE          04408764          9/1994

(Continued)

OTHER PUBLICATIONS

Barth, "ITRS commodity memory roadmap", IEEE Xplore, Jul. 28, 2003, Abstract.

(Continued)

*Primary Examiner* — Chandra Chaudhari
(74) *Attorney, Agent, or Firm* — Wells St. John P.S.

(57) ABSTRACT

The invention includes methods of forming recessed access devices. A substrate is provided to have recessed access device trenches therein. A pair of the recessed access device trenches are adjacent one another. Electrically conductive material is formed within the recessed access device trenches, and source/drain regions are formed proximate the electrically conductive material. The electrically conductive material and source/drain regions together are incorporated into a pair of adjacent recessed access devices. After the recessed access device trenches are formed within the substrate, an isolation region trench is formed between the adjacent recessed access devices and filled with electrically insulative material to form a trenched isolation region.

14 Claims, 20 Drawing Sheets

U.S. PATENT DOCUMENTS

| | | |
|---|---|---|
| 5,108,938 A | 4/1992 | Solomon |
| 5,122,848 A | 6/1992 | Lee et al. |
| 5,160,491 A | 11/1992 | Mori |
| 5,254,218 A | 10/1993 | Roberts et al. |
| 5,281,548 A | 1/1994 | Prall |
| 5,358,879 A | 10/1994 | Brady et al. |
| 5,376,575 A | 12/1994 | Kim et al. |
| 5,392,237 A | 2/1995 | Iida |
| 5,413,949 A | 5/1995 | Hong |
| 5,446,299 A | 8/1995 | Acovic et al. |
| 5,472,893 A | 12/1995 | Iida |
| 5,480,838 A | 1/1996 | Mitsui |
| 5,502,320 A | 3/1996 | Yamada |
| 5,504,357 A | 4/1996 | Kim et al. |
| 5,512,770 A | 4/1996 | Hong |
| 5,514,604 A | 5/1996 | Brown |
| 5,573,837 A | 11/1996 | Roberts et al. |
| 5,574,621 A | 11/1996 | Sakamoto et al. |
| 5,612,559 A | 3/1997 | Park et al. |
| 5,619,057 A | 4/1997 | Komatsu |
| 5,693,549 A | 12/1997 | Kim |
| 5,714,412 A | 2/1998 | Liang et al. |
| 5,714,786 A | 2/1998 | Gonzalez et al. |
| 5,739,066 A | 4/1998 | Pan |
| 5,753,947 A | 5/1998 | Gonzalez |
| 5,763,305 A | 6/1998 | Chao |
| 5,792,687 A | 8/1998 | Jeng et al. |
| 5,792,690 A | 8/1998 | Sung |
| 5,817,552 A | 10/1998 | Roesner et al. |
| 5,841,611 A | 11/1998 | Sakakima et al. |
| 5,869,359 A | 2/1999 | Prabhakar |
| 5,909,618 A | 6/1999 | Forbes et al. |
| 5,963,469 A | 10/1999 | Forbes |
| 5,972,754 A | 10/1999 | Ni et al. |
| 5,977,579 A | 11/1999 | Noble |
| 6,005,273 A | 12/1999 | Gonzalez et al. |
| 6,015,990 A | 1/2000 | Hieda et al. |
| 6,033,963 A | 3/2000 | Huang et al. |
| 6,072,209 A | 6/2000 | Noble et al. |
| 6,090,693 A | 7/2000 | Gonzalez et al. |
| 6,096,596 A | 8/2000 | Gonzalez |
| 6,114,735 A | 9/2000 | Batra et al. |
| 6,124,611 A | 9/2000 | Mori |
| 6,127,699 A | 10/2000 | Ni et al. |
| 6,150,687 A | 11/2000 | Noble et al. |
| 6,168,996 B1 | 1/2001 | Numazawa et al. |
| 6,184,086 B1 | 2/2001 | Kao |
| 6,187,643 B1 | 2/2001 | Borland |
| 6,191,470 B1 | 2/2001 | Forbes et al. |
| 6,215,149 B1 | 4/2001 | Lee et al. |
| 6,225,669 B1 | 5/2001 | Long et al. |
| 6,255,165 B1 | 7/2001 | Thurgate et al. |
| 6,259,142 B1 | 7/2001 | Dawson et al. |
| 6,297,106 B1 | 10/2001 | Pan et al. |
| 6,300,177 B1 | 10/2001 | Sundaresan et al. |
| 6,323,506 B1 | 11/2001 | Alok |
| 6,337,497 B1 | 1/2002 | Hanafi et al. |
| 6,340,614 B1 | 1/2002 | Tseng |
| 6,348,385 B1 | 2/2002 | Cha et al. |
| 6,349,052 B1 | 2/2002 | Hofmann et al. |
| 6,383,879 B1 | 5/2002 | Kizilyalli et al. |
| 6,391,726 B1 | 5/2002 | Manning |
| 6,414,356 B1 | 7/2002 | Forbes et al. |
| 6,417,085 B1 | 7/2002 | Batra et al. |
| 6,420,786 B1 | 7/2002 | Gonzalez et al. |
| 6,476,444 B1 | 11/2002 | Min |
| 6,495,474 B1 | 12/2002 | Rafferty et al. |
| 6,495,890 B1 | 12/2002 | Ono |
| 6,498,062 B2 | 12/2002 | Durcan et al. |
| 6,552,401 B1 | 4/2003 | Dennison |
| 6,563,183 B1 | 5/2003 | En et al. |
| 6,566,193 B2 | 5/2003 | Hofmann et al. |
| 6,573,559 B2 | 6/2003 | Kitada et al. |
| 6,586,808 B1 | 7/2003 | Xiang et al. |
| 6,624,032 B2 | 9/2003 | Alavi et al. |
| 6,630,720 B1 | 10/2003 | Maszara et al. |
| 6,632,714 B2 | 10/2003 | Yoshikawa |
| 6,632,723 B2 | 10/2003 | Watanabe et al. |
| 6,696,746 B1 | 2/2004 | Farrar et al. |
| 6,717,200 B1 | 4/2004 | Schamberger et al. |
| 6,727,137 B2 | 4/2004 | Brown |
| 6,753,228 B2 | 6/2004 | Azam et al. |
| 6,818,515 B1 | 11/2004 | Lee et al. |
| 6,818,937 B2 | 11/2004 | Noble et al. |
| 6,818,947 B2 | 11/2004 | Grebs et al. |
| 6,844,591 B1 | 1/2005 | Tran |
| 6,864,536 B2 | 3/2005 | Lin et al. |
| 6,888,198 B1 | 5/2005 | Krivokapic |
| 6,888,770 B2 | 5/2005 | Ikehashi |
| 6,916,711 B2 | 7/2005 | Yoo |
| 6,924,190 B2 | 8/2005 | Dennison |
| 6,939,763 B2 | 9/2005 | Schlosser et al. |
| 6,939,765 B2 * | 9/2005 | Kim et al. ................ 438/259 |
| 6,969,662 B2 | 11/2005 | Fazan et al. |
| 7,005,710 B1 | 2/2006 | Gonzalez et al. |
| 7,027,334 B2 | 4/2006 | Ikehashi et al. |
| 7,030,436 B2 | 4/2006 | Forbes |
| 7,042,009 B2 | 5/2006 | Shaheen et al. |
| 7,071,043 B2 | 7/2006 | Tang et al. |
| 7,091,092 B2 | 8/2006 | Sneelal et al. |
| 7,122,425 B2 | 10/2006 | Chance et al. |
| 7,125,774 B2 | 10/2006 | Kim et al. |
| 7,135,371 B2 | 11/2006 | Han et al. |
| 7,148,527 B2 | 12/2006 | Kim et al. |
| 7,214,621 B2 | 5/2007 | Nejad et al. |
| 7,244,659 B2 | 7/2007 | Tang et al. |
| 7,262,089 B2 | 8/2007 | Abbott et al. |
| 7,282,401 B2 | 10/2007 | Juengling |
| 7,285,812 B2 | 10/2007 | Tang et al. |
| 7,349,232 B2 | 3/2008 | Wang et al. |
| 7,361,569 B2 | 4/2008 | Tran et al. |
| 7,384,849 B2 | 6/2008 | Parekh et al. |
| 7,390,746 B2 | 6/2008 | Bai et al. |
| 7,393,789 B2 | 7/2008 | Abatchev et al. |
| 7,396,781 B2 | 7/2008 | Wells |
| 7,413,981 B2 | 8/2008 | Tang et al. |
| 7,429,536 B2 | 9/2008 | Abatchev et al. |
| 7,435,536 B2 | 10/2008 | Sandhu et al. |
| 7,455,956 B2 | 11/2008 | Sandhu et al. |
| 7,465,616 B2 | 12/2008 | Tang et al. |
| 7,488,685 B2 | 2/2009 | Kewley |
| 7,547,640 B2 | 6/2009 | Abatchev et al. |
| 7,547,945 B2 | 6/2009 | Tang et al. |
| 7,560,390 B2 | 7/2009 | Sant et al. |
| 7,589,995 B2 | 9/2009 | Tang et al. |
| 2001/0017390 A1 | 8/2001 | Long et al. |
| 2001/0025973 A1 | 10/2001 | Yamada et al. |
| 2001/0038123 A1 | 11/2001 | Yu |
| 2001/0052617 A1 | 12/2001 | Kitada et al. |
| 2002/0127796 A1 | 9/2002 | Hofmann et al. |
| 2002/0127798 A1 | 9/2002 | Prall |
| 2002/0130378 A1 | 9/2002 | Forbes et al. |
| 2002/0135030 A1 | 9/2002 | Horikawa |
| 2002/0153579 A1 | 10/2002 | Yamamoto |
| 2002/0163039 A1 | 11/2002 | Cleventer et al. |
| 2002/0192911 A1 | 12/2002 | Parke |
| 2003/0001290 A1 | 1/2003 | Nitayama et al. |
| 2003/0011032 A1 | 1/2003 | Umebayashi |
| 2003/0042512 A1 | 3/2003 | Gonzalez |
| 2003/0092238 A1 | 5/2003 | Eriguchi |
| 2003/0094651 A1 | 5/2003 | Suh |
| 2003/0161201 A1 | 8/2003 | Sommer et al. |
| 2003/0164527 A1 | 9/2003 | Sugi et al. |
| 2003/0169629 A1 | 9/2003 | Goebel et al. |
| 2003/0170955 A1 | 9/2003 | Kawamura et al. |
| 2003/0234414 A1 | 12/2003 | Brown |
| 2004/0009644 A1 | 1/2004 | Suzuki |
| 2004/0034587 A1 | 2/2004 | Amberson et al. |
| 2004/0061148 A1 | 4/2004 | Hsu |
| 2004/0070028 A1 | 4/2004 | Azam et al. |
| 2004/0125636 A1 | 7/2004 | Kurjanowicz et al. |
| 2004/0184298 A1 | 9/2004 | Takahashi et al. |
| 2004/0197995 A1 | 10/2004 | Lee et al. |
| 2004/0222458 A1 | 11/2004 | Hsieh et al. |
| 2004/0224476 A1 | 11/2004 | Yamada et al. |
| 2004/0232466 A1 | 11/2004 | Birner et al. |
| 2004/0266081 A1 | 12/2004 | Oh et al. |

| | | | |
|---|---|---|---|
| 2005/0017240 A1 | 1/2005 | Fazan | |
| 2005/0042833 A1 | 2/2005 | Park et al. | |
| 2005/0063224 A1 | 3/2005 | Fazan et al. | |
| 2005/0066892 A1 | 3/2005 | Dip et al. | |
| 2005/0104156 A1 | 5/2005 | Wasshuber | |
| 2005/0106820 A1 | 5/2005 | Tran | |
| 2005/0106838 A1 | 5/2005 | Lim et al. | |
| 2005/0124130 A1 | 6/2005 | Mathew et al. | |
| 2005/0167751 A1 | 8/2005 | Nakajima et al. | |
| 2006/0043449 A1 | 3/2006 | Tang et al. | |
| 2006/0046407 A1 | 3/2006 | Juengling | |
| 2006/0046424 A1 | 3/2006 | Chance et al. | |
| 2006/0083058 A1 | 4/2006 | Ohsawa | |
| 2006/0167741 A1 | 7/2006 | Ramachandra et al. | |
| 2006/0194410 A1 | 8/2006 | Sugaya | |
| 2006/0216894 A1 | 9/2006 | Parekh et al. | |
| 2006/0216922 A1 | 9/2006 | Tran et al. | |
| 2006/0261393 A1 | 11/2006 | Tang et al. | |
| 2006/0264001 A1 | 11/2006 | Tran et al. | |
| 2007/0001222 A1 | 1/2007 | Orlowski et al. | |
| 2007/0045712 A1 | 3/2007 | Haller et al. | |
| 2007/0048941 A1 | 3/2007 | Tang et al. | |
| 2007/0048942 A1 | 3/2007 | Hanson et al. | |
| 2007/0051997 A1 | 3/2007 | Haller et al. | |
| 2007/0096204 A1 | 5/2007 | Shiratake | |
| 2007/0117310 A1 | 5/2007 | Bai et al. | |
| 2007/0128856 A1 | 6/2007 | Tran et al. | |
| 2007/0138526 A1 | 6/2007 | Tran et al. | |
| 2007/0148984 A1 | 6/2007 | Abatchev et al. | |
| 2007/0158719 A1 | 7/2007 | Wang | |
| 2007/0166920 A1 | 7/2007 | Tang et al. | |
| 2007/0178641 A1 | 8/2007 | Kim et al. | |
| 2007/0238299 A1 | 10/2007 | Niroomand et al. | |
| 2007/0238308 A1 | 10/2007 | Niroomand et al. | |
| 2007/0261016 A1 | 11/2007 | Sandhu et al. | |
| 2008/0012056 A1 | 1/2008 | Gonzalez | |
| 2008/0012070 A1 | 1/2008 | Juengling | |
| 2008/0042179 A1 | 2/2008 | Haller et al. | |
| 2008/0061346 A1 | 3/2008 | Tang et al. | |
| 2008/0099847 A1 | 5/2008 | Tang et al. | |
| 2008/0142882 A1 | 6/2008 | Tang et al. | |
| 2008/0166856 A1 | 7/2008 | Parekh et al. | |
| 2008/0299774 A1 | 12/2008 | Sandhu | |
| 2008/0311719 A1 | 12/2008 | Tang et al. | |
| 2009/0035665 A1 | 2/2009 | Tran | |
| 2009/0311845 A1 | 12/2009 | Tang et al. | |

FOREIGN PATENT DOCUMENTS

| | | |
|---|---|---|
| DE | 19928781 | 7/2000 |
| EP | 0453998 | 10/1991 |
| EP | 1003219 | 5/2000 |
| EP | 1067597 | 1/2001 |
| EP | 1089344 | 4/2001 |
| EP | 1271632 | 1/2003 |
| EP | 1391939 | 2/2004 |
| JP | 07-106435 | 4/1995 |
| JP | 07-297297 | 11/1995 |
| JP | 11-274478 | 10/1999 |
| KR | 19930006930 | 4/1993 |
| KR | 19940006679 | 4/1994 |
| TW | 574746 | 2/2004 |
| TW | 200411832 | 7/2004 |
| WO | WO 8603341 | 6/1986 |
| WO | WO 9744826 | 11/1997 |
| WO | WO 02089182 | 11/2002 |
| WO | WO 2005083770 | 9/2005 |
| WO | PCT/US2006/008295 | 8/2006 |
| WO | PCT/US2004/034587 | 10/2006 |
| WO | PCT/US2005/030668 | 10/2006 |
| WO | PCT/US2006/031555 | 12/2006 |
| WO | PCT/US2007/001953 | 9/2007 |
| WO | PCT/US2007/016573 | 1/2008 |
| WO | PCT/US2007/014689 | 4/2008 |
| WO | PCT/US2007/019592 | 3/2009 |
| WO | PCT/US2007/023767 | 5/2009 |

OTHER PUBLICATIONS

Bashir et al., "Characterization of sidewall defects in selective epitaxial growth of silicon", American Vacuum Society, May/Jun. 1995, pp. 923-927.

Bashir et al., "Reduction of sidewall defect induced leakage currents by the use of nitrided field oxides in silicon selective epitaxial growth isolation for advanced ultralarge scale integration", American Vacuum Society, Mar./Apr. 2000, pp. 695-699.

Bernstein et al., Chapter 3, 3.4-3.5, SOI Device Electrical Properties, pp. 34-53.

Bhave, et al., "Developer-soluble Gap fill materials for patterning metal trenches in Via-first Dual Damascene process", 2004 Society of Photo-Optical Instrumentation Engineers, Proceedings of SPIE: Advances in Resist Technology and Processing XXI, vol. 5376, 2004.

Chen et al., "The Enhancement of Gate-Induced-Drain-Leakage (GIDL) Current in Short-Channel SOI MOSFET and its Application in Measuring Lateral Bipolar Current Gain B," IEEE Electron Device Letters, vol. 13, No. 11, pp. 572-574 (Nov. 1992).

Choi et al., "Investigation of Gate-Induced Drain Leakage (GIDL) Current in Thin Body Devices: Single-Gate Ultrathin Body, Symmetrical Double-Gate, and Asymmetrical Double-Gate MOSFETs" JPN. J. Appl. Phys., vol. 42, pp. 2073-2076 (2003).

Clarke, "Device Structures Architectures compatible with conventional silicon processes—Vertical transistors plumbed for memory, logic", Electronic Engineering Times, p. 24, Feb. 14, 2000.

Fazan et al., "MOSFET design simplifies DRAM", EE Times, May 13, 2002, pp. 1-4.

Gonzalez et al., "A dynamic source-drain extension MOSFET using a separately biased conductive spacer", Solid-State Electronics, vol. 46, pp. 1525-1530 (2002).

Hammad et al., "The Pseudo-Two-Dimensional Approach to Model the Drain Section in SOI MOSFETs", 2001 IEEE Transactions on Electron Devices, vol. 48, No. 2, Feb. 2001, pp. 386-387.

Hara, "Toshiba cuts capacitor from DRAM cell design", EE Times, Feb. 7, 2002, pp. 1-3.

Henkels et al., "Large-Signal 2T, 1C DRAM Cell: Signal and Layout Analysis", 1994 IEEE Journal of Solid-State Circuits, Jul. 29, 1994, No. 7, pp. 829-832.

Keast, et al., "Silicon Contact Formation and Photoresist Planarization Using Chemical Mechanical Polishing", 1994 ISMIC, Jun. 7-8, 1994 VMIC Conference, pp. 204-205.

Kim et al., "An outstanding and highly manufacturable 80nm DRAM technology". Mar. 2003. IEEE.

Kim et al., "The Breakthrough in data retention time of DRAM using Recess-Channel-Array Transistor (RCAT) for 88nm feature size and beyond", 2003 Symposium on VLSI Technology Digest of Technical Papers, 2 pages.

Kuo et al., "A Capacitorless Double-Gate DRAM Cell Design for High Density Applications", IEEE, IEDM, pp. 843-846 (2002).

Lammers, "Bell Labs opens gate to deeper-submicron CMOS", Electronic Engineering Times, Dec. 6, 1999, p. 18.

Liu, "Dual-Work-Function Metal Gates by Full Silicidation of Poly-Si with Co-Ni Bi-Layers", 2005 IEEE, vol. 26, No. 4, Apr. 2005, pp. 228-230.

Lusky et al., "Investigation of Channel Hot Electron Injection by Localized Charge-Trapping Nonvolatile Memory Devices", IEEE Transactions on Electron Devices, vol. 51, No. 3, pp. 444-451 (Mar. 2004).

Lusky, et al., "Investigation of Channel Hot Electron Injection by Localized Charge-Trapping Nonvolatile Memory Devices", IEEE Transactions on Electron Devices, vol. 51, No. 3, Mar. 2004, pp. 444-451.

Maeda et al., "Impact of a Vertical Pi-Shape Transistor (VPiT) Cell for 1 Gbit DRAM and Beyond", IEEE Transactions on Electron Devices Dec. 1995, No. 12, pp. 2117-2124.

Minami et al., "A Floating Body Cell (FBC) Fully Compatible with 90nm CMOS Technology (CMOS IV) for 128Mb SOI DRAM", IEEE, 2005, 4 pages.-

Minami et al., "A High Speed and High Reliability MOSFET Utilizing an Auxiliary Gate", 1990 Symposium on VLSI Technology, IEEE, pp. 41-42 (1990).

Mo et al., "Formation and Properties of ternary silicide (CoxNi1-x) Si2 thin films", 1998 IEEE, pp. 271-274.

Ranica et al., "A One Transistor Cell on Bulk Substrate (1T-Bulk) for Low-Cost and High Density eDRAM", 2004 Symposium on VLSI Technology Digest of Technical Papers, pp. 128-129.

Risch et al., "Vertical MOS Transistors wtih 70nm Channel Length", 1996 IEEE vol. 43, No. 9, Sep. 1996, pp. 1495-1498.

Sivagnaname et al., "Stand-by Current in PD-SOI Pseudo-nMOS Circuits", 2003 IEEE, pp. 95-96.

Sunouchi et al., "Double LDD Concave (DLC) Structure for Sub-Half Micron MOSFET", IEDM, 1988 IEEE, 4 pages.

Tanaka et al., "Scalability Study on a Capacitorless 1T-DRAM: From Single-gate PD-SOI to Double-gate FinDRAM", IEEE, 2004, pp. 37.5.1-37.5.4.

Tiwari et al., "Straddle Gate Transistors: High Ion/Ioff Transistors at Short Gate Lengths", IBM Research Article, pp. 26-27 (pre-Mar. 2006).

Villaret, "Mechanisms of charge modulation in the floating body of triple-well nMOSFET capacitor-less DRAMs", Microelectronic Engineering 72, 2004, pp. 434-439.

Wang et al., "Achieving Low junction capacitance on bulk SI MOSFET using SDOI process", Micron Technology, Inc., 12 pages.

Yoshida et al., "A Capacitorless 1T-DRAM Technology Using Gate-Induced Drain-Leakage (GIDL) Current for Low-Power and High-Speed Embedded Memory", IEEE Transactions on Electron Devices, vol. 53, No. 4, pp. 692-697 (Apr. 2006).

Yoshida et al., "A Design of a Capacitorless 1T-DRAM Cell Using Gate-induced Drain Leakage (GIDL) Current for Low-power and High-speed Embedded Memory", 2003 IEEE, 4 pages.

* cited by examiner

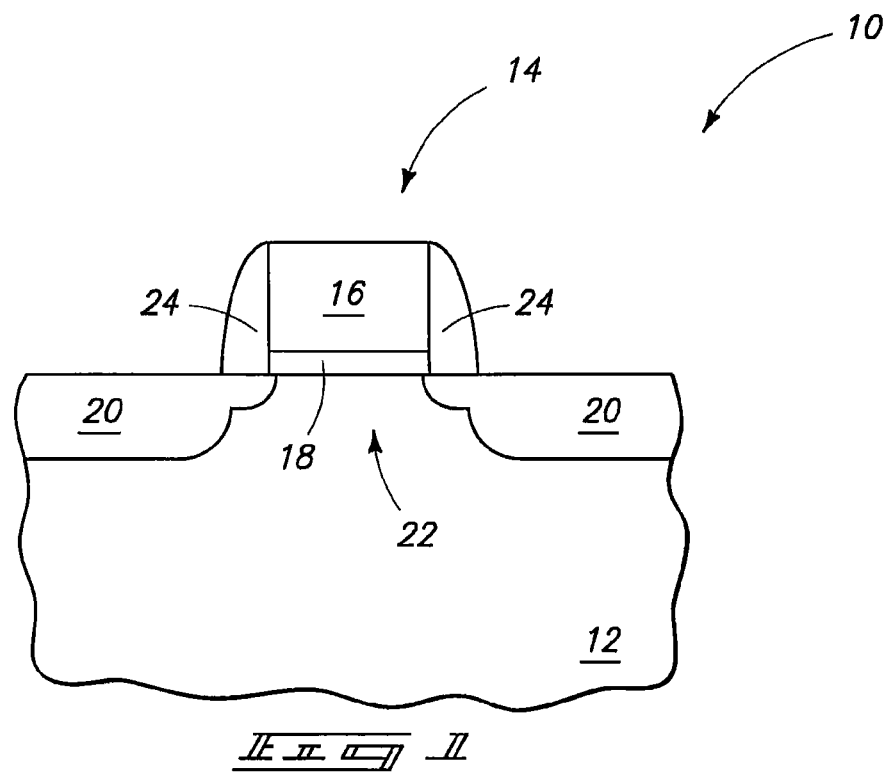
_Fig. 1_
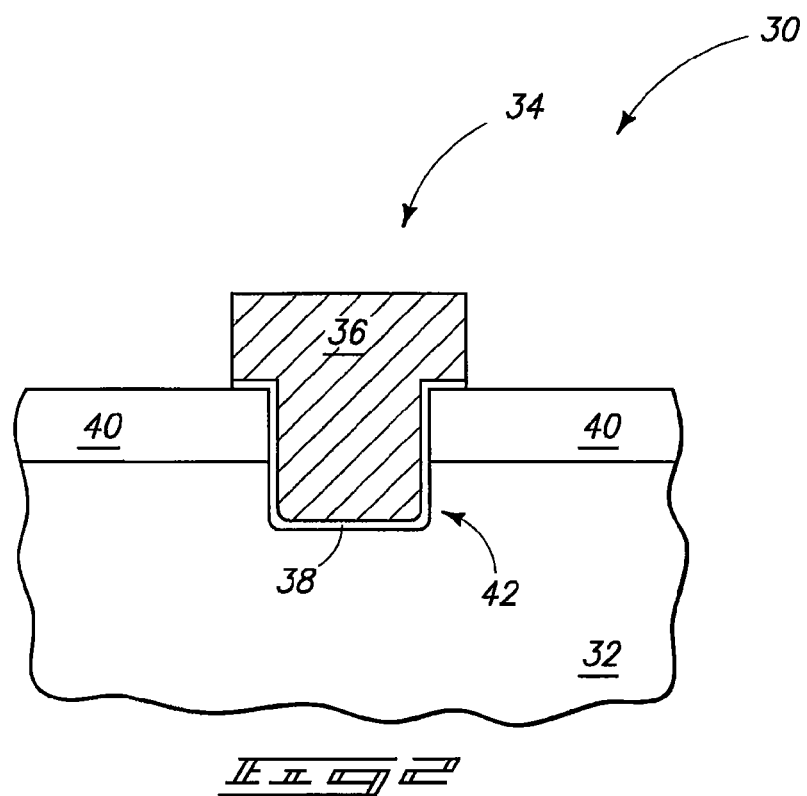
_Fig. 2_

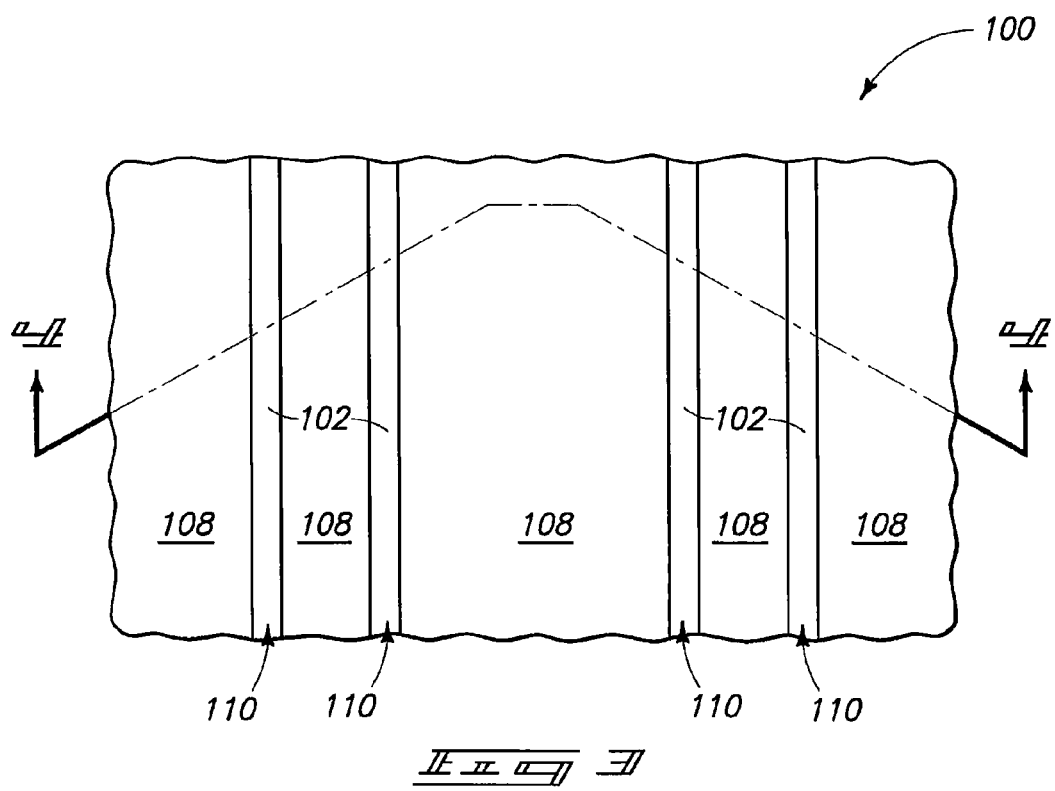
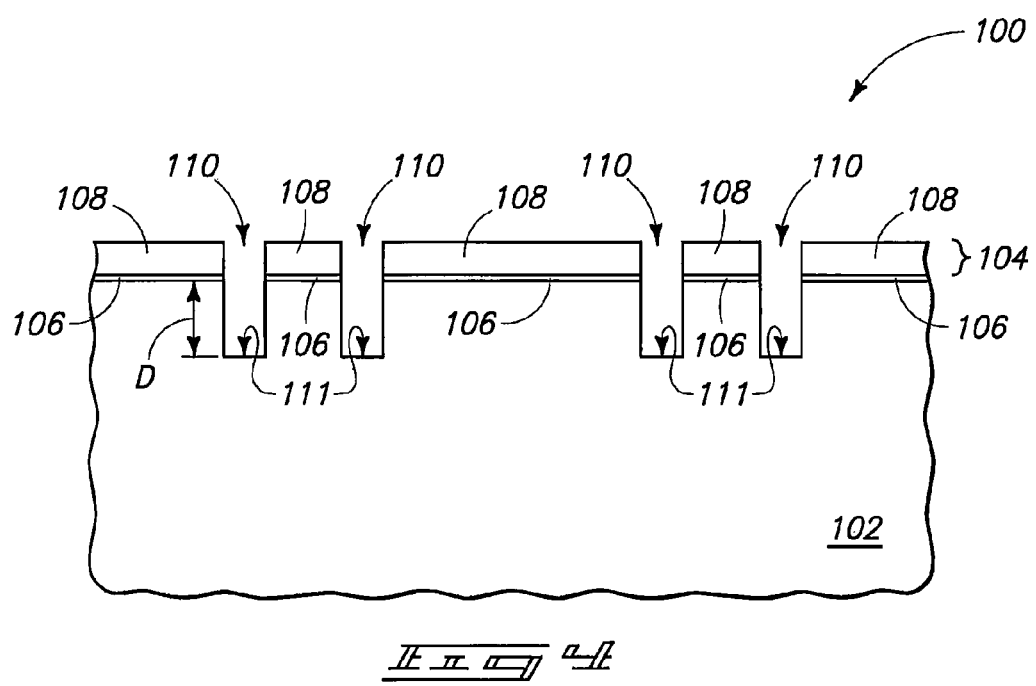

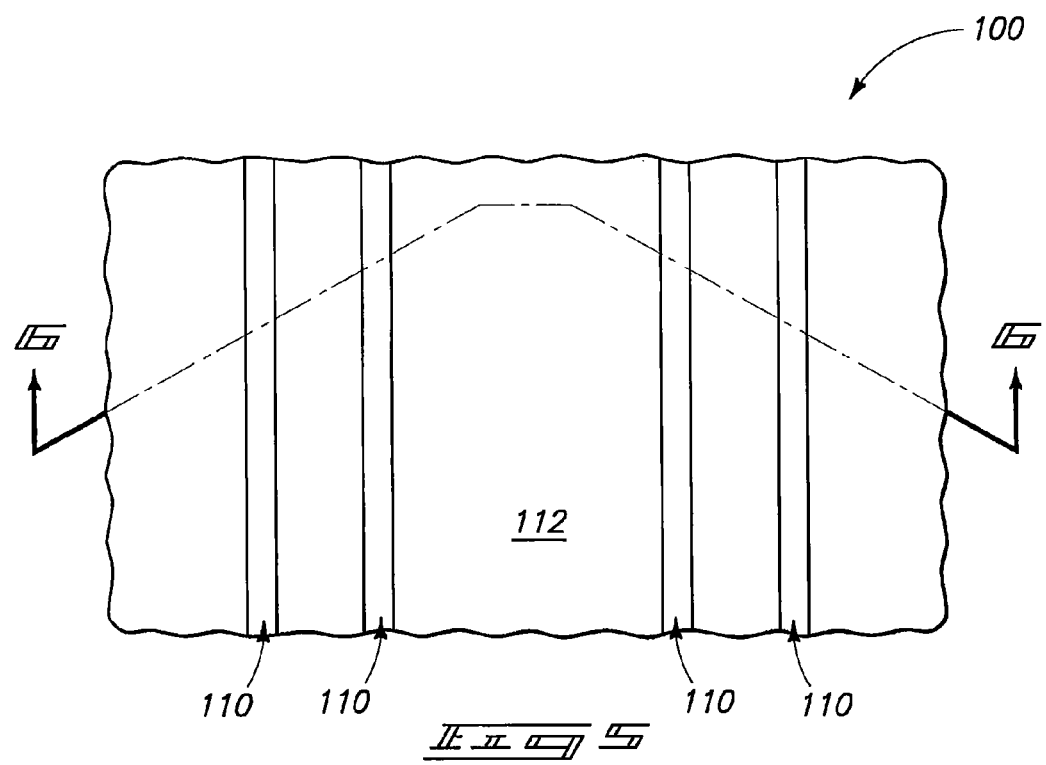
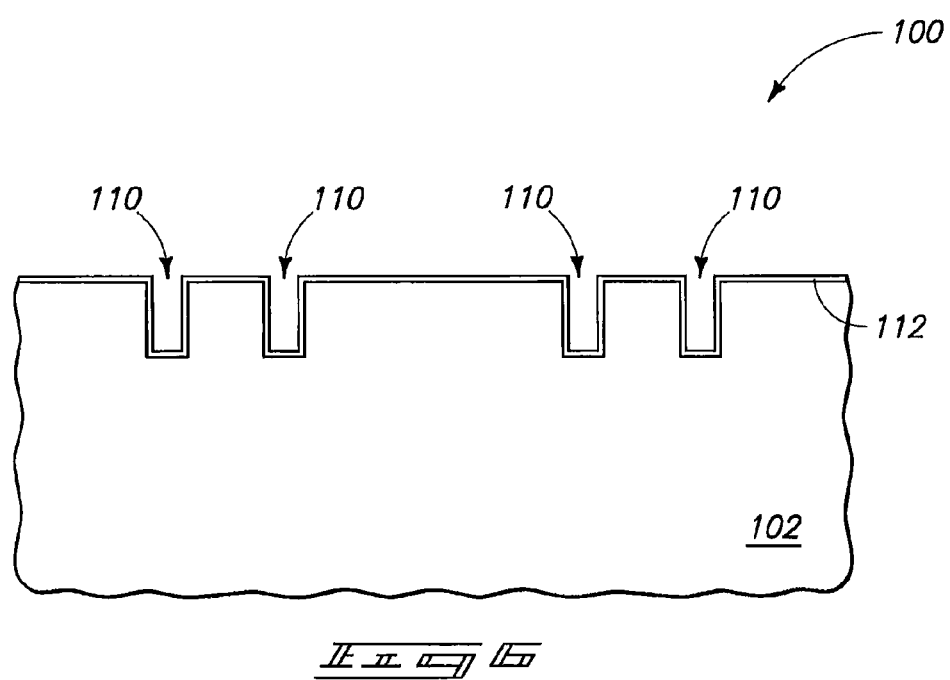

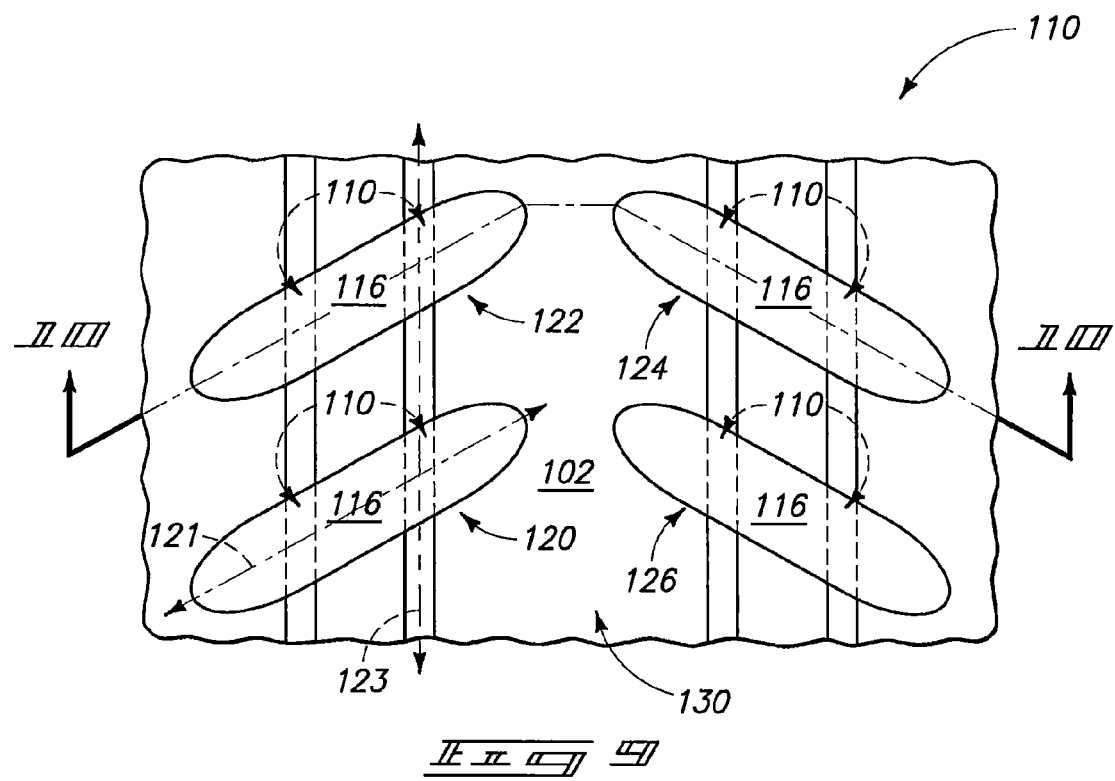
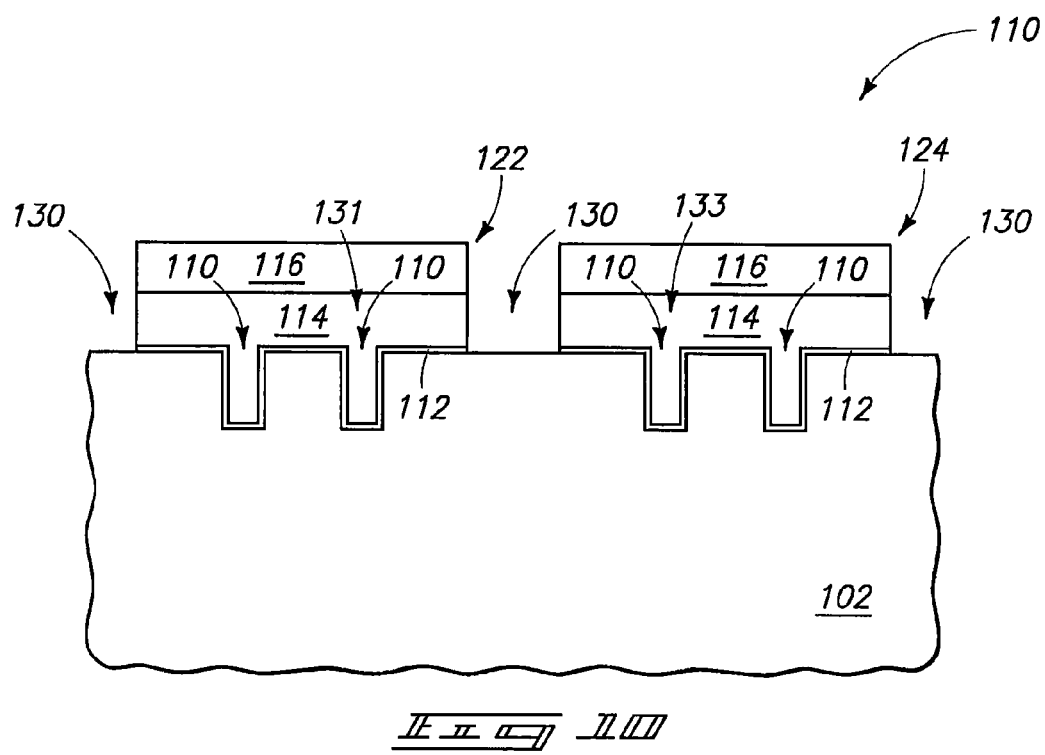

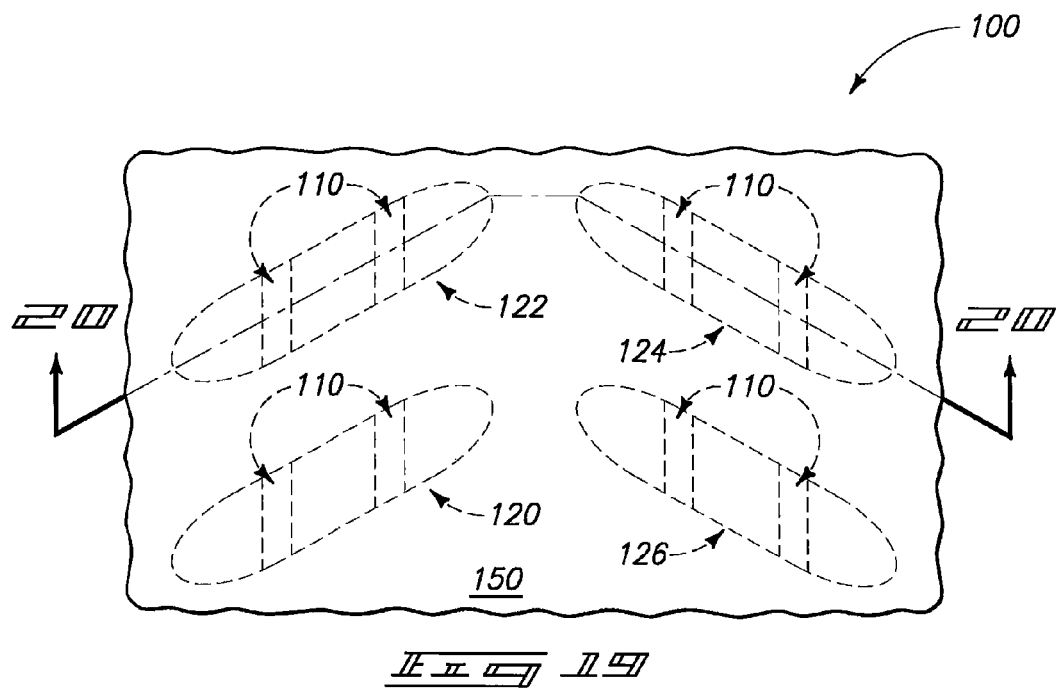
_Fig 19_
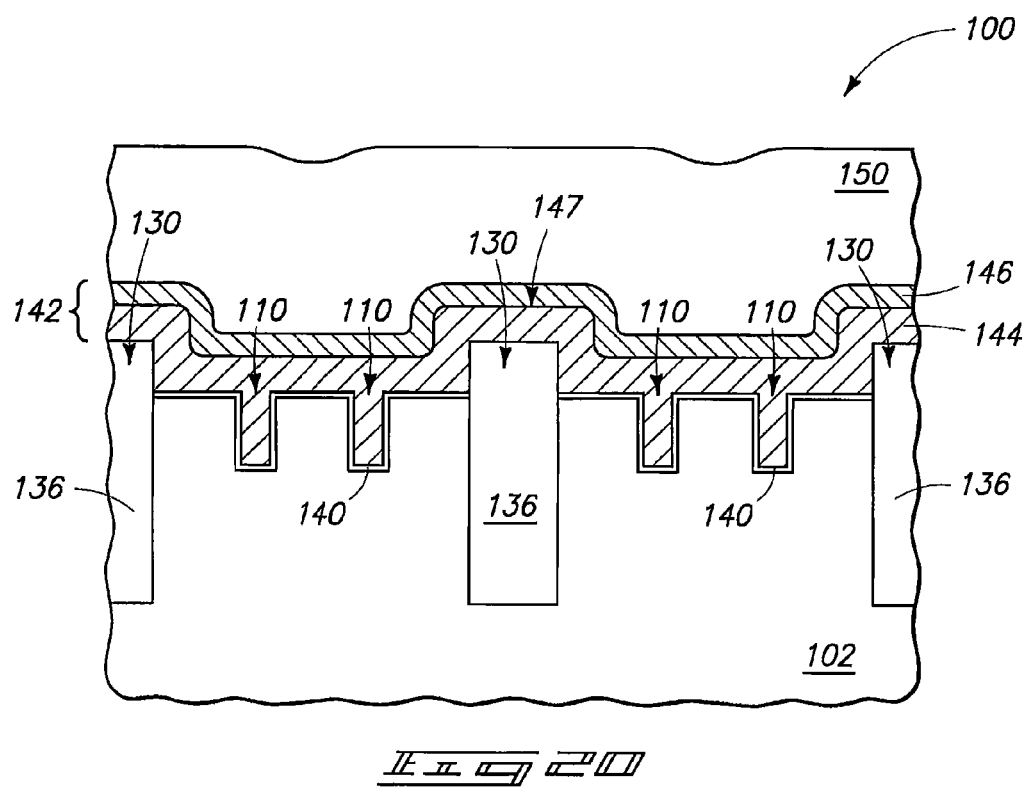
_Fig 20_

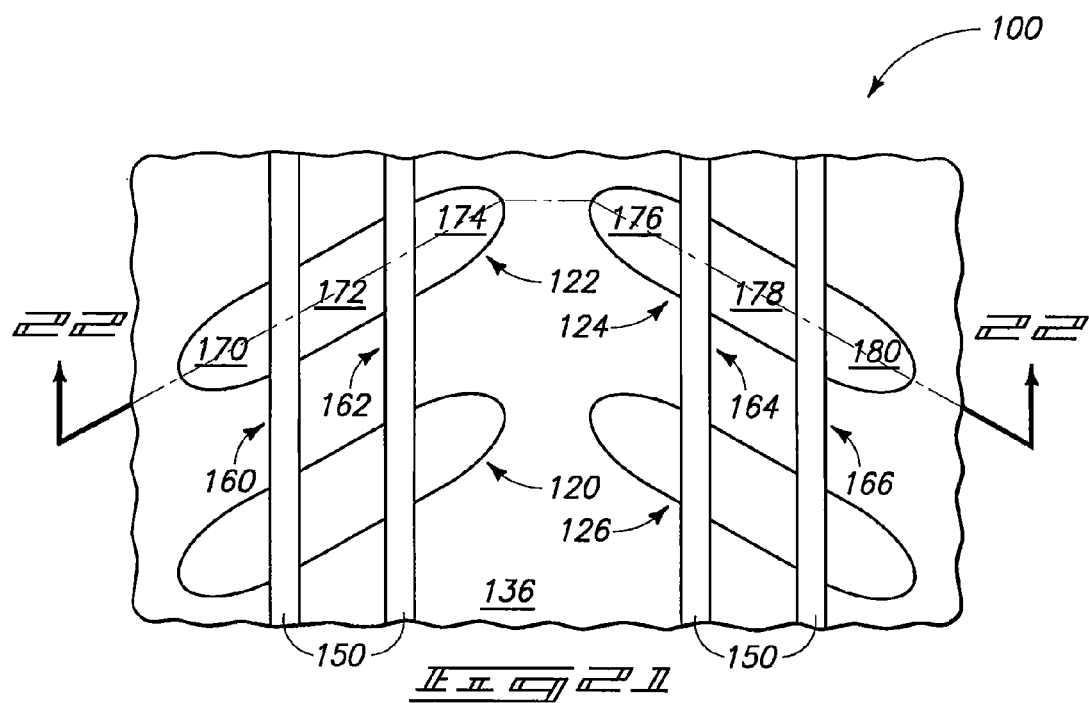

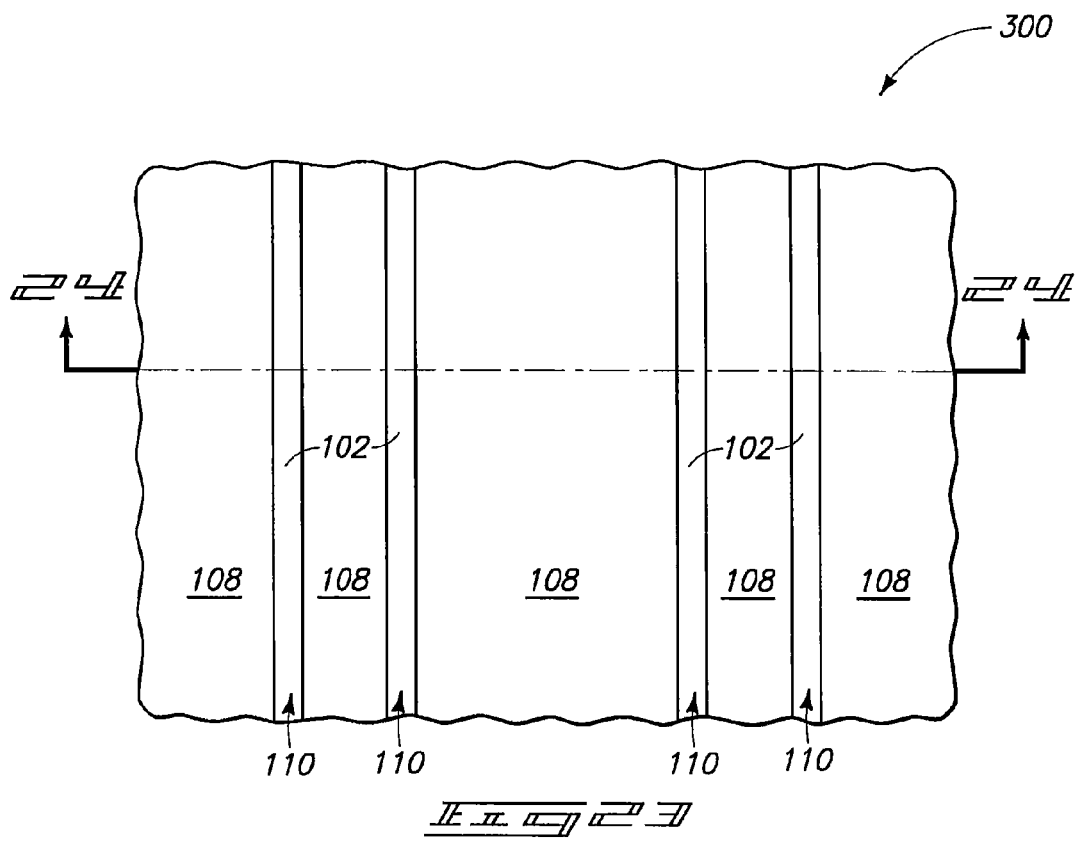
_Fig. 23_
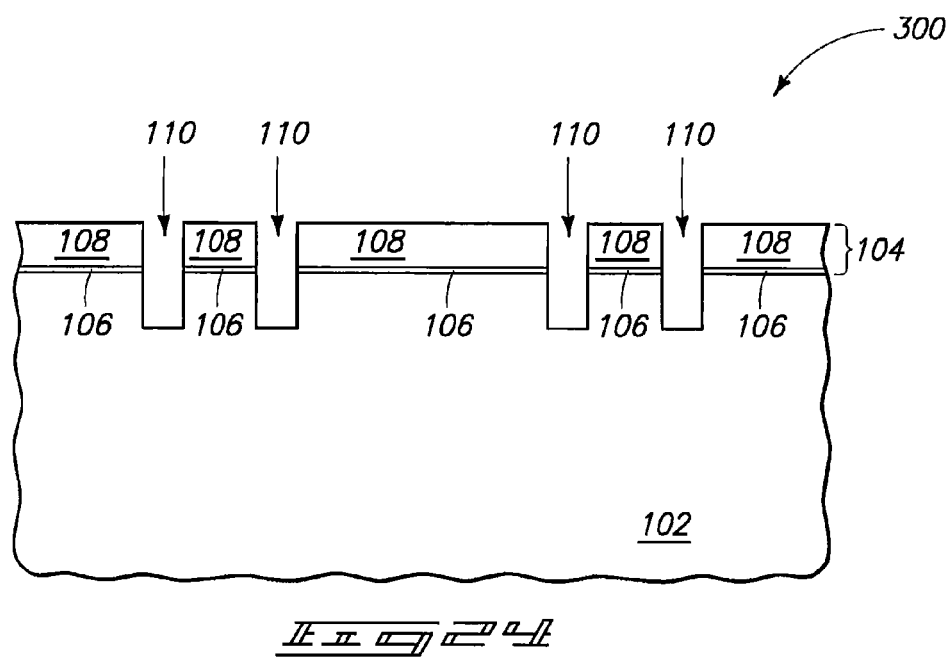
_Fig. 24_

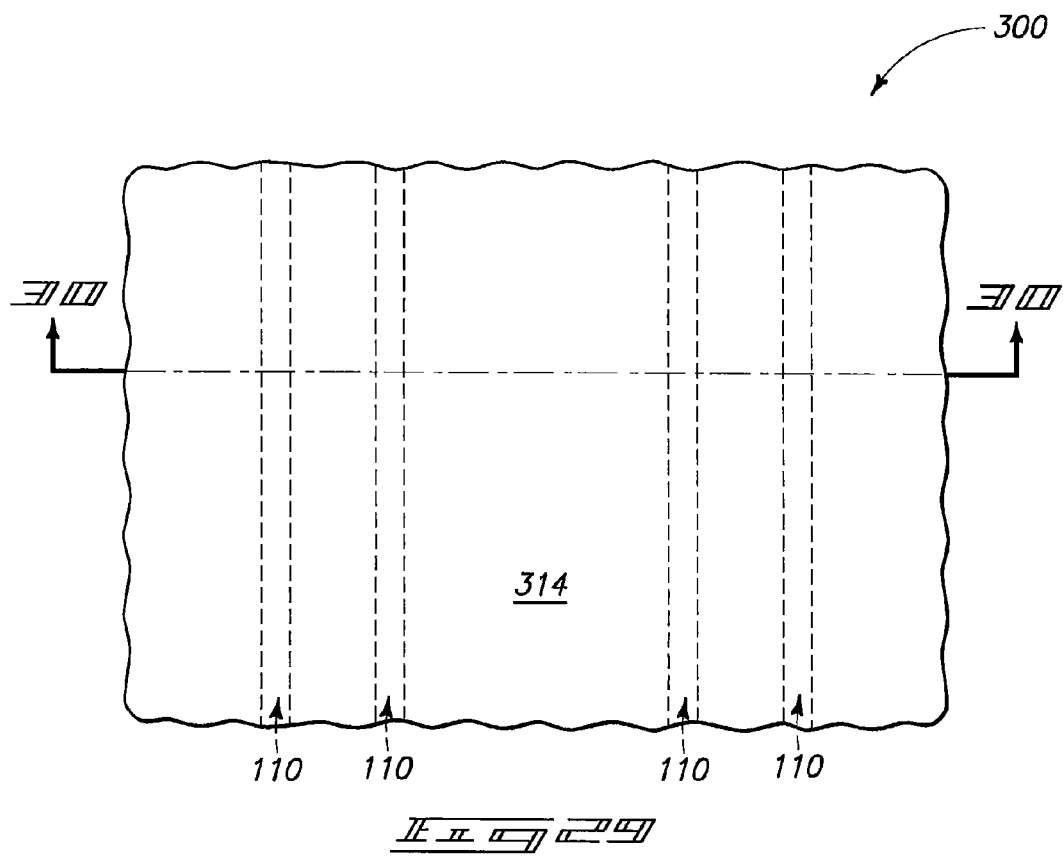
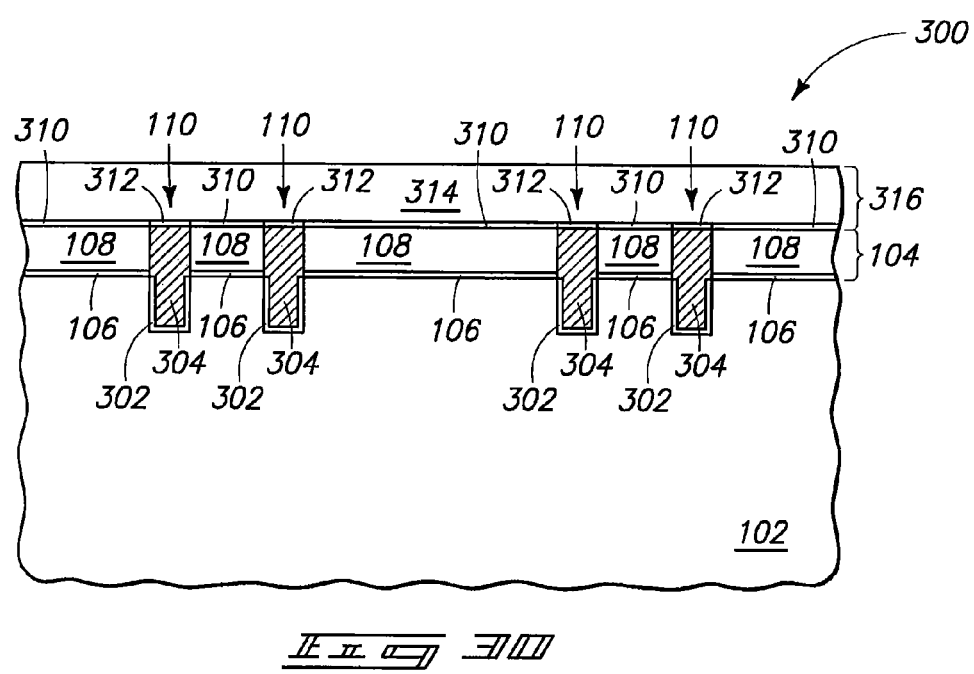

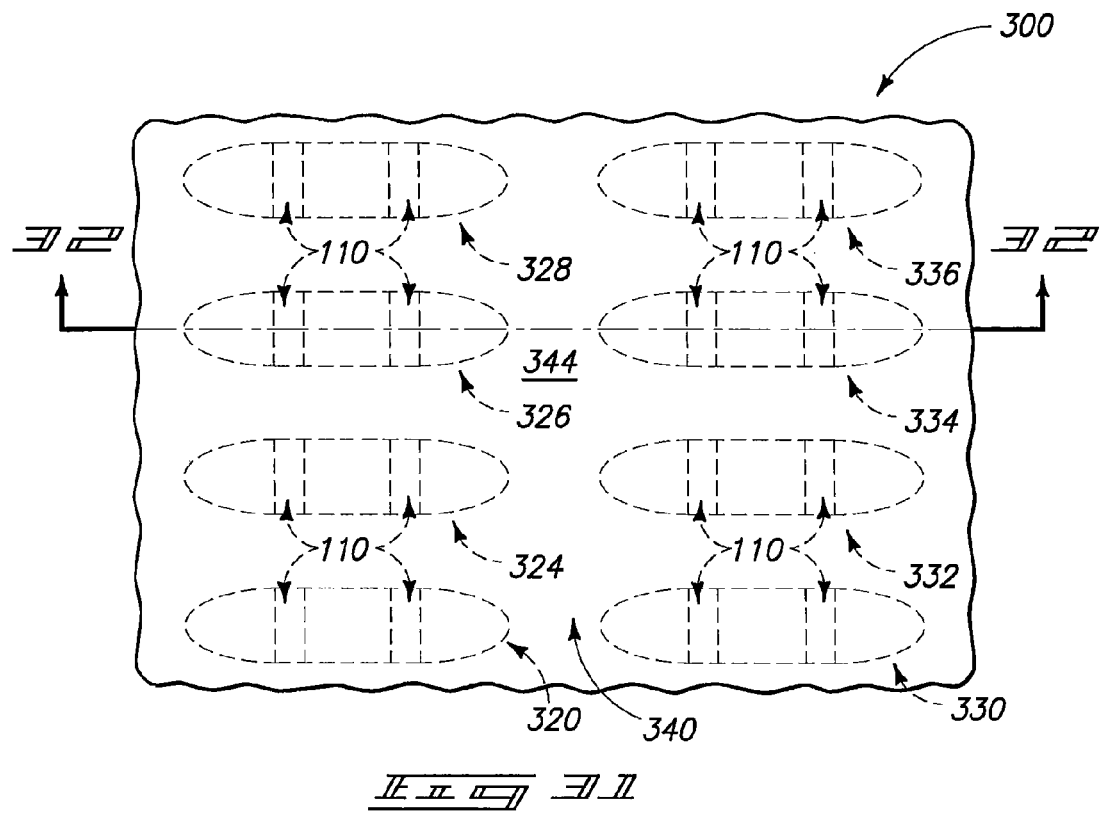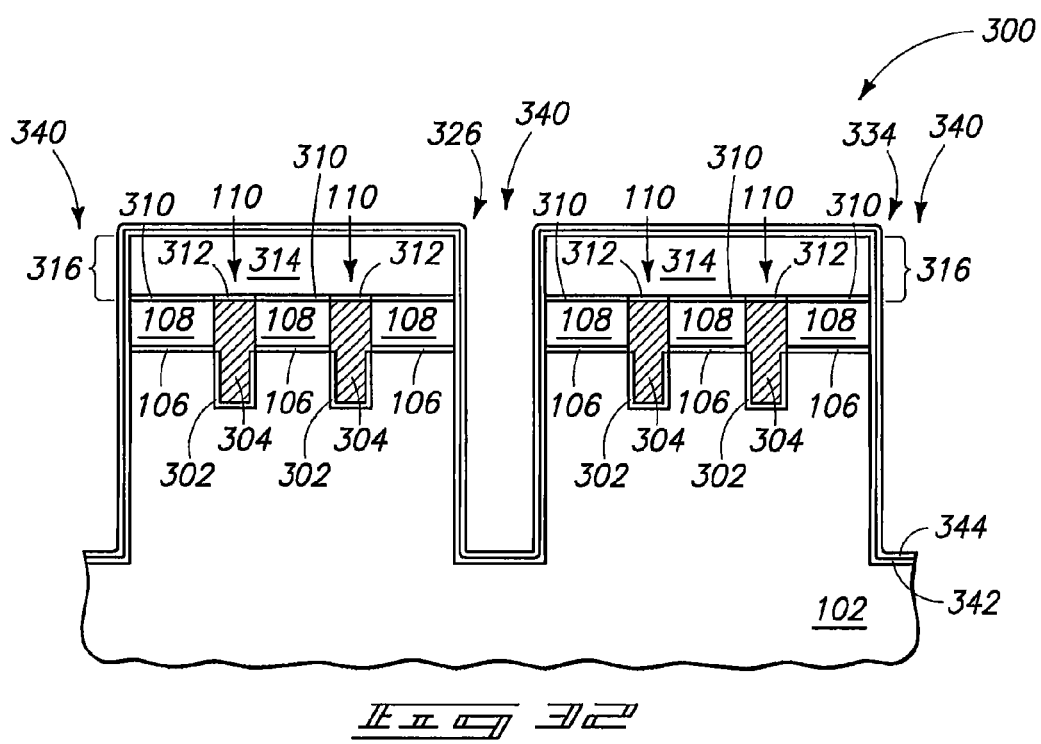

METHODS OF FORMING RECESSED ACCESS DEVICES ASSOCIATED WITH SEMICONDUCTOR CONSTRUCTIONS

RELATED PATENT DATA

This patent resulted from a continuation of U.S. patent application Ser. No. 12/051,620, which was filed Mar. 19, 2008, which issued as U.S. Pat. No. 7,897,460, and which is hereby incorporated herein by reference; which resulted from a continuation of U.S. patent application Ser. No. 11/090,529, which was filed Mar. 25, 2005, which issued as U.S. Pat. No. 7,384,849, and which is hereby incorporated herein by reference.

TECHNICAL FIELD

This invention pertains to methods of forming recessed access devices associated with semiconductor constructions.

BACKGROUND OF THE INVENTION

A semiconductor transistor device is a device comprising a gate which interconnects a pair of source/drain regions with one another through a channel controlled by the gate. Transistor devices are common circuit devices of semiconductor constructions. For instance transistor devices can be incorporated into memory structures, including, for example, dynamic random access memory (DRAM) and static random access memory (SRAM).

A continuing goal in semiconductor fabrication is to increase a level of integration, and thus decrease the amount of semiconductor real-estate consumed by devices. Decreasing the size of transistor devices, however, leads to numerous difficulties. For instance, as the channel-length of a transistor device is decreased, numerous problems occur in attempting to control electron flow between source/drain regions on opposing sides of the channel. These problems are generically referred to as short-channel effects.

One approach that may have utility for overcoming short-channel problems is to recess transistor devices within a substrate so that the devices consume less real-estate than if they were non-recessed, and yet have relatively long channels. A non-recessed transistor device is shown in FIG. 1, and a recessed device is shown in FIG. 2 for comparison to the non-recessed device.

Referring initially to FIG. 1, a semiconductor construction 10 is illustrated to comprise a substrate 12. The substrate 12 can comprise, for example, monocrystalline silicon lightly-doped with background p-type dopant. To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

A transistor device 14 is supported by the substrate. The transistor device includes a gate 16 spaced from substrate 12 by a dielectric material 18; includes sidewall spacers 24 along sidewalls of the gate; includes a pair of source/drain regions 20 on opposing sides of the gate; and includes a channel region 22 between the source/drain regions.

The gate 16 can comprise various electrically conductive materials, including, for example, various metals, metal compositions, and/or conductively-doped silicon or other conductively-doped semiconductor material. Dielectric material 18 can comprise any suitable material or combination of materials, and typically will comprise, consist essentially of, or consist of silicon dioxide. Sidewall spacers 24 can comprise any suitable compositions or combination of compositions, and typically will comprise one or both of silicon nitride and silicon dioxide. Source/drain regions 20 can comprise conductively-doped regions within monocrystalline substrate 12, and can comprise heavily-doped regions with lightly-doped extensions. For instance, the source/drain regions 20 can comprise either heavily n-type doped regions or heavily p-type doped regions, and can comprise lightly-doped portions extending under sidewalls 24. Channel region 22 is doped with a threshold voltage implant, and operably interconnects the source/drain regions 20 with one another when sufficient current passes through gate 16.

FIG. 2 shows a construction 30 comprising a semiconductor substrate 32 and a transistor 34 supported by the substrate. The transistor comprises a gate 36 extending within the substrate, a dielectric material 38 between the gate and the substrate, source/drain regions 40 within the substrate proximate the gate, and a channel region 42 extending around a lowermost portion of the gate and interconnecting the source/drain regions 40 with one another. Although not shown, sidewall spacers can be provided proximate gate 36 similar to the spacers 24 discussed above with reference to FIG. 1.

The substrate 32, dielectric material 38, gate 36 and source/drain regions 40 can comprise identical materials to those discussed above regarding the substrate 12, gate 16, dielectric material 18 and source/drain regions 20 of FIG. 1. Also, a threshold voltage implant can be provided within channel region 42 similar to the threshold voltage implant provided within region 22 of FIG. 1.

A difference between the recessed device construction of FIG. 2 relative to the non-recessed device construction of FIG. 1 is that the channel region 42 of the device of FIG. 2 is lengthened by virtue of the channel region extending around a recessed portion of the gate 36. Such can reduce short-channel effects for the transistor device 34 of FIG. 2 relative to the device 14 of FIG. 1.

Although recessed access devices have advantages relative to non-recessed devices in terms of the packing density that can be achieved while avoiding short-channel effects, there are various problems encountered in large-scale fabrication of recessed access devices which are to be addressed if recessed access devices are to become commercially feasible. Accordingly, it is desired to develop new methodology for large-scale fabrication of recessed access devices. One application for recessed access devices is in memory arrays, such as, for example, DRAM arrays. Accordingly, it would be further desirable if methodologies developed for large-scale fabrication of recessed access devices were applicable to fabrication of memory arrays.

SUMMARY OF THE INVENTION

In one aspect, the invention includes a method of forming recessed access devices. A semiconductor substrate is provided. Recessed access device trenches are formed within the substrate. A pair of the recessed access device trenches are adjacent one another. Electrically conductive gate material is formed within the recessed access device trenches. Source/drain regions are formed proximate the conductive gate material. The conductive gate material and source/drain regions together form an adjacent pair of recessed access devices (specifically, a pair of recessed access transistors). After the recessed access device trenches are formed within the substrate, an isolation region trench is formed between the adjacent recessed access devices. The isolation region trench is filled with electrically insulative material to form a trenched isolation region.

In one aspect, the invention includes another method of forming recessed access devices. A semiconductor construction is provided, and recessed access device trenches are formed within the substrate. The recessed access device trenches are filled with a first electrically insulative material. The first electrically insulative material is patterned into a mask defining a plurality of access device regions. The access device regions are islands surrounded by isolation regions. The access device regions comprise only portions of the recessed access device trenches. The substrate is etched within the isolation regions to recess the substrate of the isolation regions. The recessed substrate is covered with a second electrically insulative material to cover the isolation regions. At least a majority of the first electrically insulative material is removed while leaving at least a majority of the second electrically insulative material. Subsequently, gate material is formed within the portions of the recessed access device trenches comprised by the access device regions.

In one aspect, the invention includes yet another method of forming recessed access devices. A semiconductor substrate is provided, and a first patterned mask is formed over the substrate. The first patterned mask has openings extending therethrough defining first locations for trenches of recessed access devices. The substrate is etched in the first locations to form recessed access device trenches extending into the substrate. The recessed access device trenches are filled with a gate material. A first electrically insulative material is formed over the first patterned mask and over the gate material. The first electrically insulative material is patterned into a mask defining a plurality of access device regions. The access device regions are islands surrounded by isolation regions. The access device regions comprise only portions of the recessed access device trenches. The substrate is etched to recess the substrate of said isolation regions. The recessed substrate is covered with a second electrically insulative material. The first electrically insulative material is removed. Subsequently, a plurality of conductive lines are formed. Individual conductive lines extend across multiple access device regions and electrically interconnect gate material of the multiple access device regions with one another.

BRIEF DESCRIPTION OF THE DRAWINGS

Preferred embodiments of the invention are described below with reference to the following accompanying drawings.

FIG. 1 is a diagrammatic, cross-sectional view of a semiconductor wafer fragment illustrating a prior art transistor device.

FIG. 2 is a diagrammatic, cross-sectional view of a semiconductor wafer fragment illustrating another prior art transistor device.

FIGS. 3 and 4 are a diagrammatic top view and diagrammatic cross-sectional side view of a semiconductor wafer fragment illustrated at a preliminary processing stage of an exemplary aspect of the present invention. The cross-section of FIG. 4 is along the line 4-4 of FIG. 3.

FIGS. 5 and 6 illustrate the fragments of FIGS. 3 and 4, respectively, at a processing stage subsequent to that of FIGS. 3 and 4. The cross-section of FIG. 6 is along the line 6-6 of FIG. 5.

FIGS. 9 and 10 illustrate the fragments of FIGS. 3 and 4, respectively, at a processing stage subsequent to that of FIGS. 7 and 8. The cross-section of FIG. 10 is along the line 10-10 of FIG. 9.

FIGS. 19 and 20 illustrate the fragments of FIGS. 3 and 4, respectively, at a processing stage subsequent to that of FIGS. 17 and 18. The cross-section of FIG. 20 is along the line 20-20 of FIG. 19.

FIGS. 21 and 22 illustrate the fragments of FIGS. 3 and 4, respectively, at a processing stage subsequent to that of FIGS. 19 and 20. The cross-section of FIG. 22 is along the line 22-22 of FIG. 21.

FIGS. 23 and 24 are a diagrammatic top view and diagrammatic cross-sectional side view of a semiconductor wafer fragment shown at a preliminary processing stage of an exemplary aspect of a second embodiment of the present invention. The cross-section of FIG. 24 is along the line 24-24 of FIG. 23.

FIGS. 29 and 30 illustrate the fragments of FIGS. 23 and 24, respectively, at a processing stage subsequent to that of FIGS. 27 and 28. The cross-section of FIG. 30 is along the line 30-30 of FIG. 29.

FIGS. 31 and 32 illustrate the fragments of FIGS. 23 and 24, respectively, at a processing stage subsequent to that of FIGS. 29 and 30. The cross-section of FIG. 32 is along the line 32-32 of FIG. 31.

FIGS. 37 and 38 illustrate the fragments of FIGS. 23 and 24, respectively, at a processing stage subsequent to that of FIGS. 35 and 36. The cross-section of FIG. 38 is along the line 38-38 of FIG. 37.

DETAILED DESCRIPTION OF THE PREFERRED EMBODIMENTS

Figure 7:
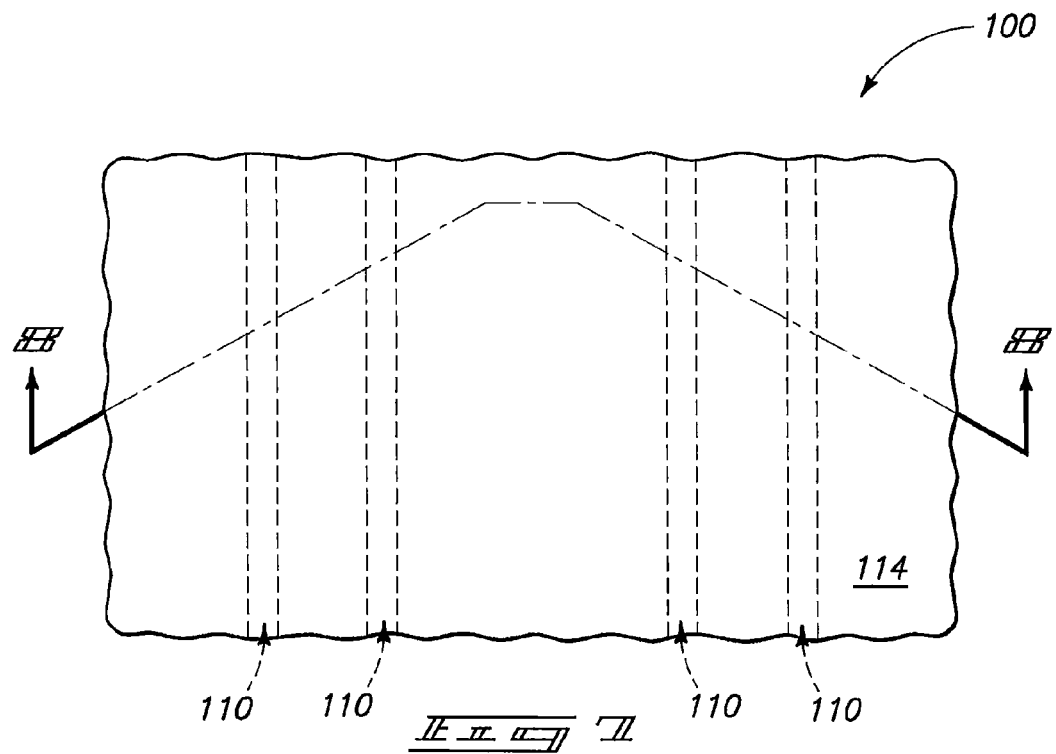
FIGS. 7 and 8 illustrate the fragments of FIGS. 3 and 4, respectively, at a processing stage subsequent to that of FIGS. 5 and 6. The cross-section of FIG. 8 is along the line 8-8 of FIG. 7.

This disclosure of the invention is submitted in furtherance of the constitutional purposes of the U.S. Patent Laws "to promote the progress of science and useful arts" (Article 1, Section 8).

The invention includes various methods for forming recessed access devices associated with semiconductor constructions. In particular aspects, structures are formed which contain recessed access devices and shallow trench isolation regions to electrically separate adjacent devices. Accordingly, recessed access device gate trenches and shallow trench isolation region trenches are fabricated. In contrast to prior art processes which form shallow trench isolation region trenches prior to formation of recessed access device gate trenches, some methods of the present invention form recessed access device gate trenches prior to forming shallow trench isolation region trenches. Although the recessed access device gate trenches are formed prior to the shallow trench isolation region trenches, gate material can be formed within the recessed access device gate trenches either prior to, or after, formation of the shallow trench isolation region trenches.

Exemplary aspects of the invention are described with reference to FIGS. 3-40, with FIGS. 3-22 pertaining to a first embodiment aspect of the invention, and FIGS. 23-40 pertaining to a second embodiment aspect of the invention.

Referring initially to FIGS. 3 and 4, a semiconductor construction 100 is illustrated at a preliminary processing stage of the first embodiment aspect of the present invention. Construction 100 comprises a substrate 102 which can, for example, comprise, consist essentially of, or consist of monocrystalline silicon lightly background-doped with p-type dopant.

A patterned mask 104 is formed over the substrate. The shown patterned mask comprises a first layer 106 comprising, consisting essentially of, or consisting of silicon dioxide; and a second layer 108 comprising, consisting essentially of, or consisting of silicon nitride. The mask 104 can be formed into the shown pattern by providing a photolithographically patterned photoresist (not shown) over mask 104, transferring a pattern from the photoresist to the materials of mask 104, and subsequently removing the photoresist.

The patterned mask 104 has openings 110 extending therethrough, with such openings defining locations for trenches of recessed access devices. The locations of openings 110 can be referred to as first locations in the discussion that follows.

Substrate 102 is etched through the first locations defined by mask 104 to form recessed access device trenches extending into substrate 102. In particular aspects, such trenches will extend into monocrystalline silicon of substrate 102. The trenches are shown having bottom peripheries 111 and a depth "D" from an uppermost surface of substrate 102 to the bottom peripheries. Such depth can be, for example, from about 100 Å to about 2000 Å.

In exemplary aspects of the invention, the substrate 102 can comprise monocrystalline silicon having p-well and/or n-well implants therein at the processing stage of FIGS. 3 and 4. The layer 106 can be formed by oxidizing an uppermost surface of the monocrystalline silicon to form the layer 106 to consist essentially of, or consist of silicon dioxide, and to have a thickness of from about 50 Å to about 100 Å. The nitride cap 108 can comprise a thickness of from about 200 Å to about 500 Å, and typically will comprise a thickness of from about 300 Å to about 500 Å.

In some aspects (not shown) a critical dimension of the openings 110 can be shrunk with a two-step process. First, the masking layer 104 is etched to form the shown openings 110. Subsequently, nitride spacers are formed along sidewalls of the openings 110 by providing a silicon nitride layer extending along the sidewalls and within the openings, and subsequently subjecting such layer to anisotropic etching to form the spacers. The openings can then be extended into substrate 102 after forming such spacers, so that the openings have a smaller critical dimension than the dimension initially formed with photolithographic processing.

Referring next to FIGS. 5 and 6, mask 104 (FIGS. 3 and 4) is removed and a layer 112 is formed over substrate 102 and within trenches 110. The layer 112 can, for example, comprise, consist essentially of, or consist of silicon dioxide. In such aspects, layer 112 can be formed by thermally oxidizing an exposed upper surface of a monocrystalline substrate 102.

Figure 8:
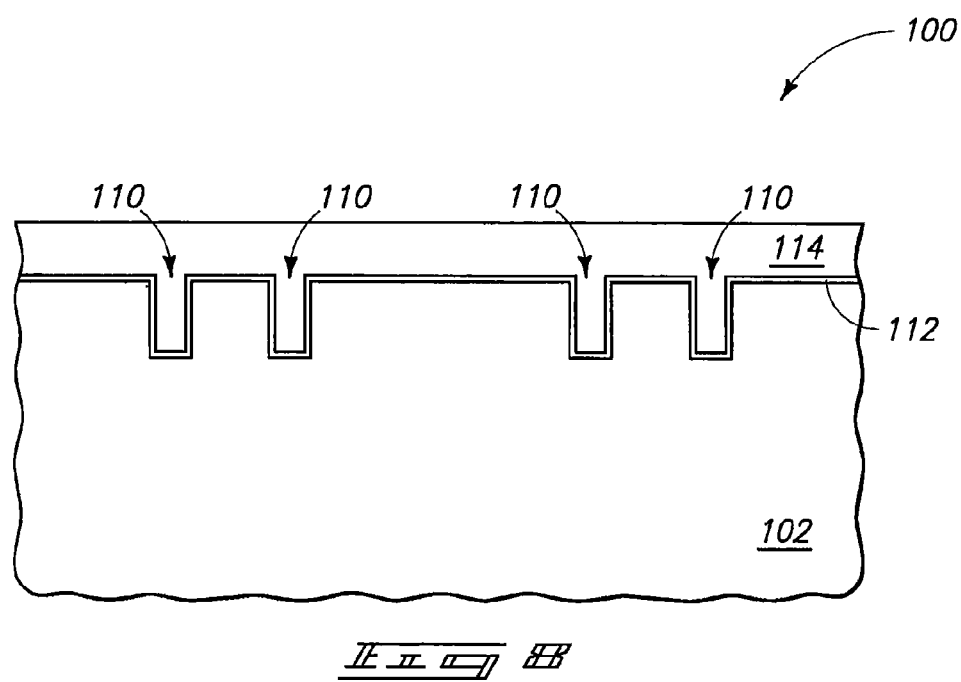

Referring next to FIGS. 7 and 8, a layer 114 comprising, consisting essentially of, or consisting of silicon nitride is formed over layer 112. It is to be understood that the compositions of layers 112 and 114 provided herein are exemplary compositions, and that the layers can comprise any suitable compositions. Layers 112 and 114 can together be referred to as a first insulative material provided to fill trenches 110. The trenches 110 are shown in dashed-line view in FIG. 7 to indicate the locations of the trenches beneath insulative material 114.

Referring next to FIGS. 9 and 10, photolithographically patterned photoresist 116 is provided over the layer 114. The photoresist defines a pattern which is to be transferred into the first insulative material comprising layers 112 and 114. Subsequently, such pattern is transferred to layers 112 and 114 with a suitable etch, which patterns layers 112 and 114 into a mask. The mask defines a plurality of access device regions 120, 122, 124 and 126. The access device regions are islands surrounded by an isolation region 130. The access device regions 120, 122, 124 and 126 comprise only portions of the recessed access device trenches 110 that had been initially formed (i.e., the trenches of FIGS. 7 and 8), with remaining portions of the trenches being within isolation region 130.

The shown access device regions 120, 122, 124 and 126 are substantially elliptical in the view of FIG. 9. The substantially elliptical access device regions have primary longitudinal elliptical axes, with an exemplary primary longitudinal elliptical axis being shown as an axis 121 within region 120. It is noted that the trenches 110 can be considered to comprise primary length axes extending along their lengths, with an exemplary length axis being illustrated as an axis 123 in FIG. 9. In the application illustrated in FIG. 9, the primary longitudinal elliptical axis 121 is canted relative to axis 123, and accordingly is not substantially orthogonal to the primary length axis 123. It is to be understood, however, that the invention also encompasses aspects (such as, for example, an aspect described with reference to FIGS. 31 and 32 below) in which the primary longitudinal elliptical axis of an access device region is substantially orthogonal to the primary length axis of a recessed access device trench.

Figure 11:
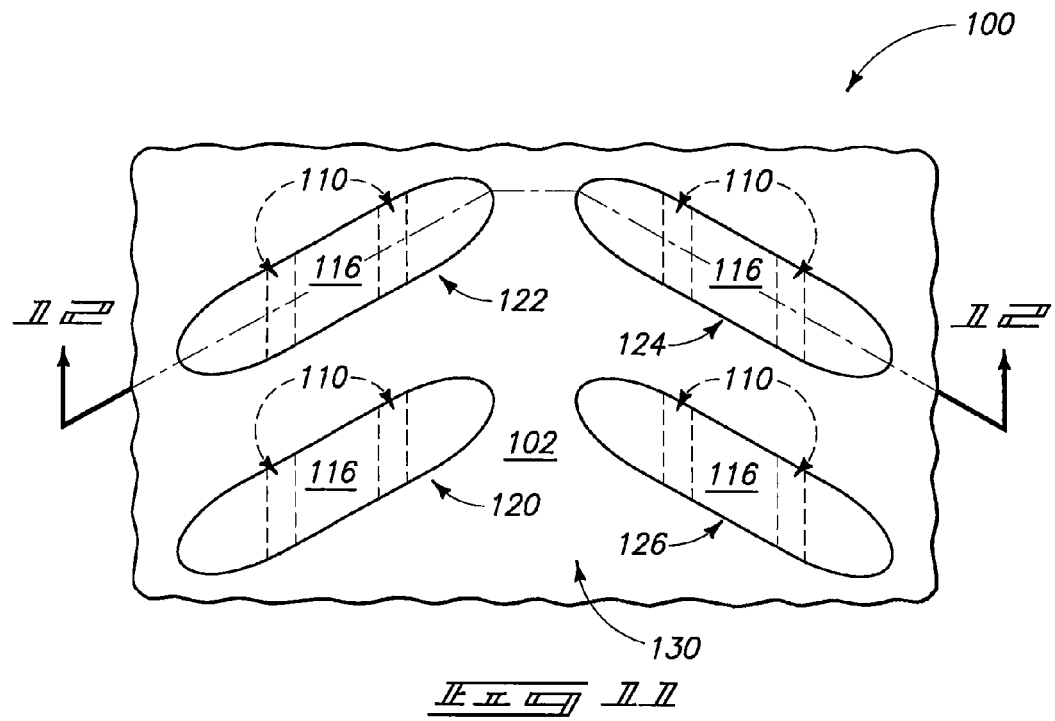
FIGS. 11 and 12 illustrate the fragments of FIGS. 3 and 4, respectively, at a processing stage subsequent to that of FIGS. 9 and 10. The cross-section of FIG. 12 is along the line 12-12 of FIG. 11.
Figure 12:
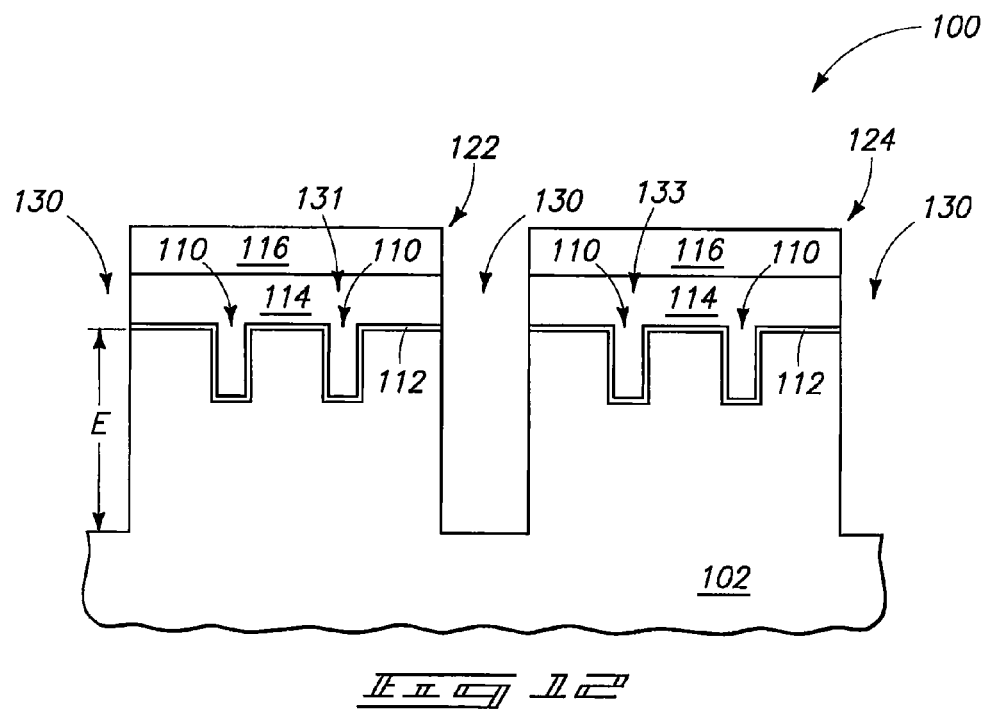

Referring next to FIGS. 11 and 12, the substrate of isolation regions 130 is recessed with an etch. The etch removes portions of trenches 110 between recessed access device regions 120, 122, 124 and 126.

After the etch, the recessed substrate of isolation region 130 is at a depth "E" beneath an uppermost surface of substrate 102. In particular aspects, the substrate can be recessed to a level beneath a lowestmost level of recessed access device trenches 110 such that depth "E" is at least about two-fold greater than the depth "D" of FIG. 4. Depth "E" can correspond to a depth of a shallow trench isolation region, and in particular aspects can be from about 500 Å to about 3500 Å.

Two of the trenches 110 of FIG. 12 can be considered to be adjacent to one another, and the isolation region 130 can be considered to be formed between such adjacent trenches. For instance, one of the adjacent trenches can be a trench labeled 131, and the other can be a trench labeled 133, and such trenches can be considered to be on opposing sides of a deep trench formed between them in isolation region 130. In the shown processing of the present invention, the adjacent recessed access device trenches 131 and 133 have been formed prior to formation of the deep trench between them.

Figure 13:
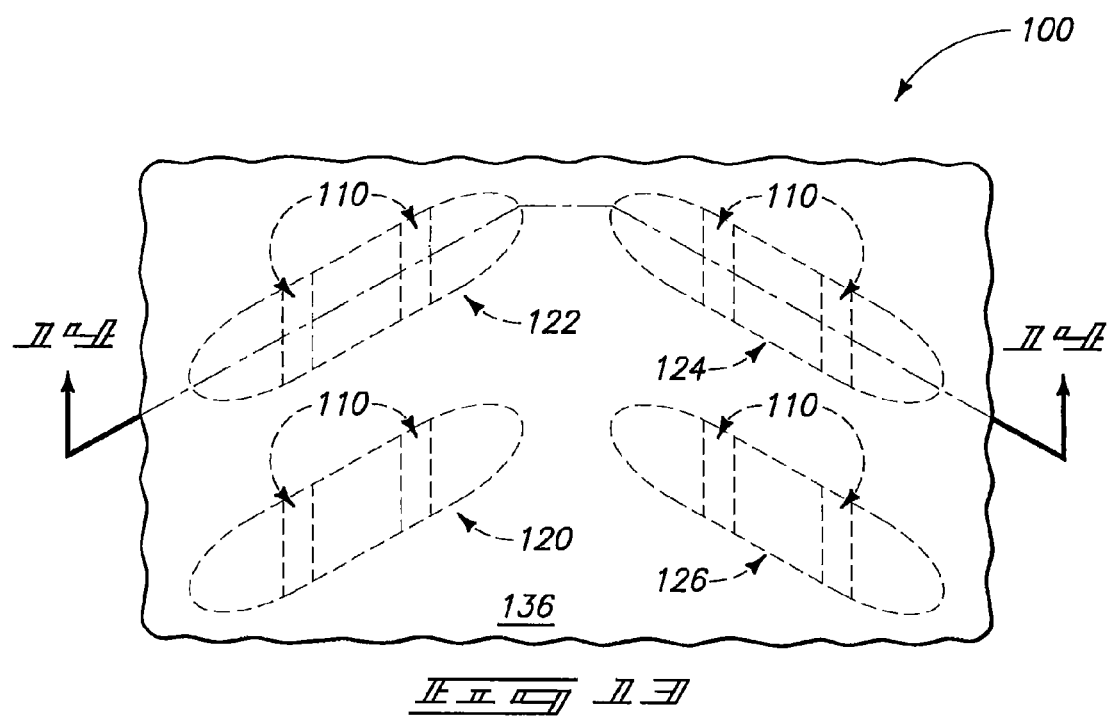
FIGS. 13 and 14 illustrate the fragments of FIGS. 3 and 4, respectively, at a processing stage subsequent to that of FIGS. 11 and 12. The cross-section of FIG. 14 is along the line 14-14 of FIG. 13.
Figure 14:
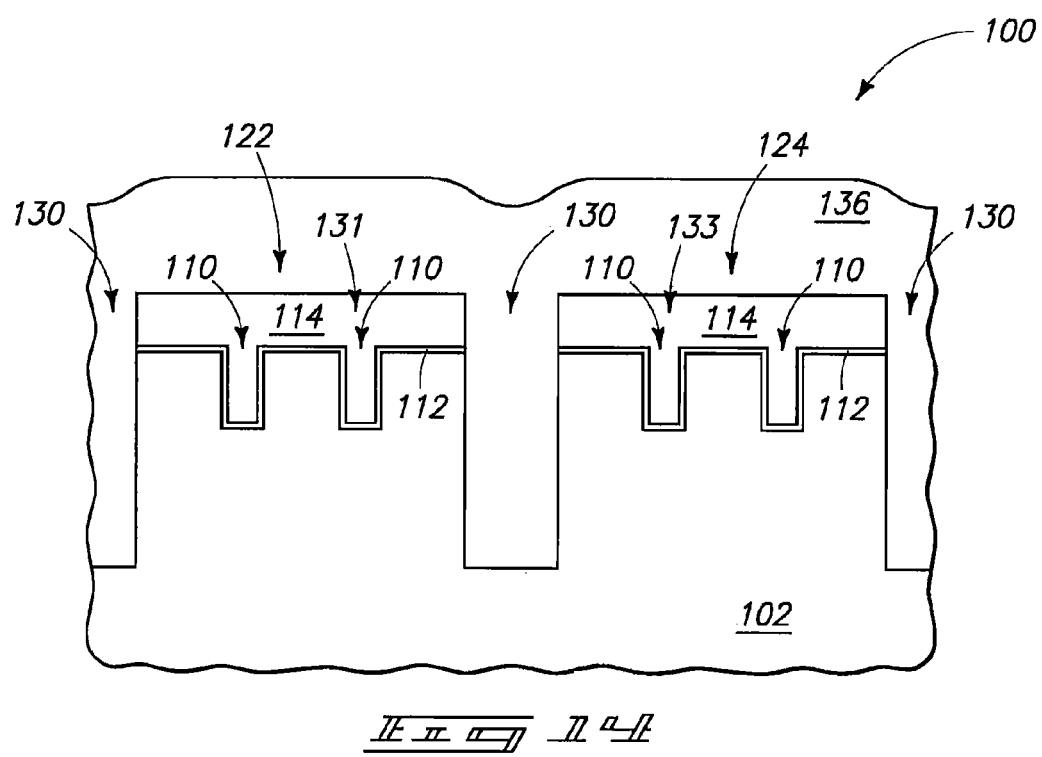

Referring next to FIGS. 13 and 14, photoresist 116 (FIGS. 11 and 12) is removed, and subsequently an electrically insulative material 136 is formed over the recessed substrate of isolation region 130, as well as over layer 114 of the access device regions 120, 122, 124 and 126. The access device regions 120, 122, 124 and 126 are shown in dashed-line view in FIG. 13 to indicate the locations of such regions, but it is to be understood that the regions are beneath insulative material 136 at the processing stage of FIG. 13.

Material 136 can comprise any suitable composition or combination of compositions. In particular aspects, material 136 can correspond to a so-called shallow trench stack, and accordingly can comprise a thin layer of silicon dioxide along substrate 102, a thin silicon nitride liner over the silicon dioxide, and a thick silicon dioxide fill within the liner. In other words, insulative material 136 can primarily comprise silicon dioxide, with the bulk silicon dioxide of the material being separated from substrate 102 by a thin silicon nitride liner and a thin silicon dioxide liner. The bulk insulative composition of material 136 can, in some aspects, be a spin-on-dielectric.

In the view of FIG. 14, the dielectric-filled deep region 130 can be considered to comprise a trenched isolation region provided between recessed access device trenches 131 and 133.

Figure 15:
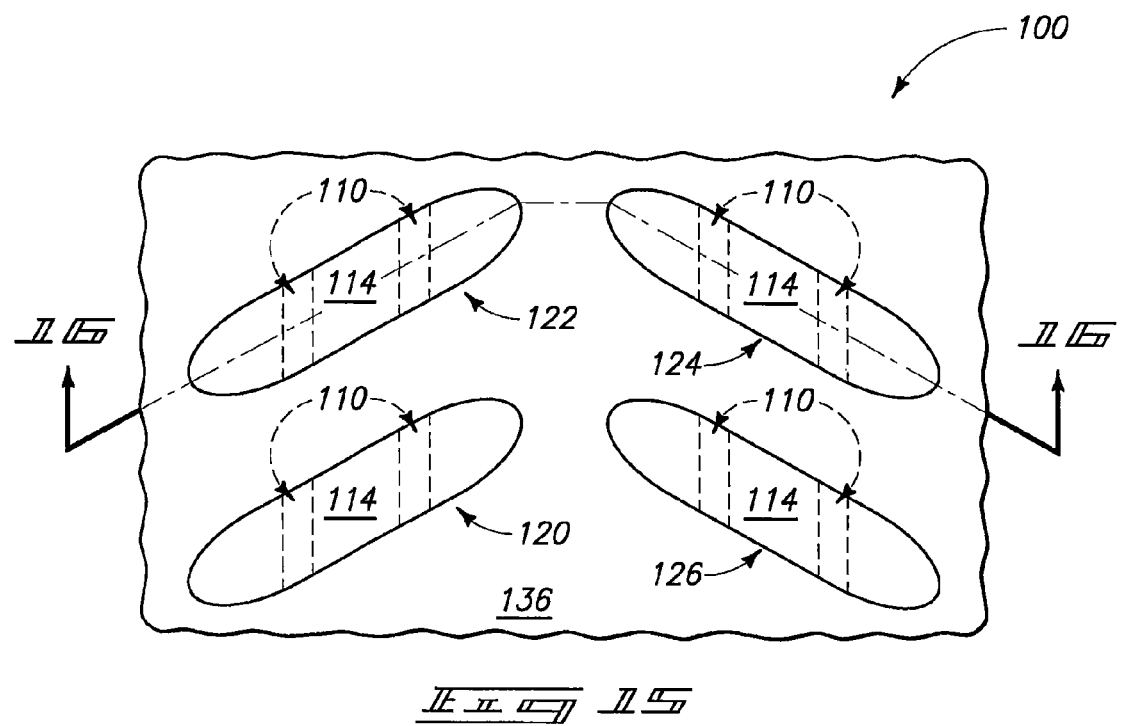
FIGS. 15 and 16 illustrate the fragments of FIGS. 3 and 4, respectively, at a processing stage subsequent to that of FIGS. 13 and 14. The cross-section of FIG. 16 is along the line 16-16 of FIG. 15.
Figure 16:
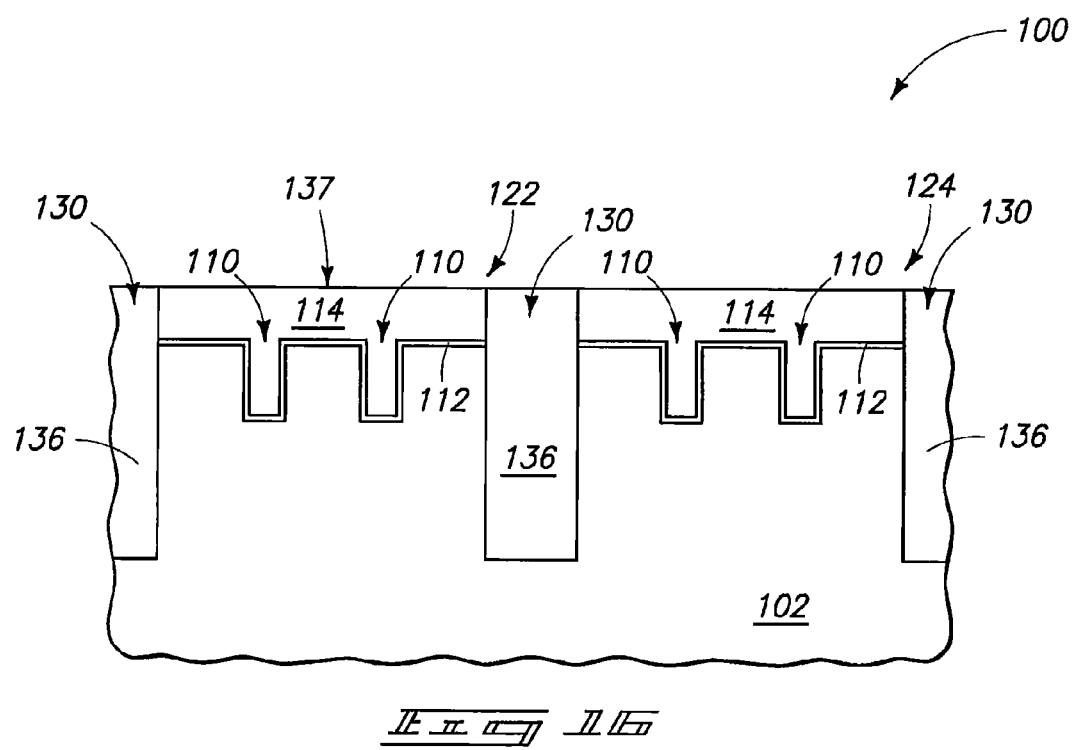

Referring next to FIGS. 15 and 16, material 136 is subjected to planarization (such as, for example, chemical-mechanical planarization) to remove the material from over the layer 114, and to form a planarized upper surface 137 extending across material 136 and layer 114. The planarization of FIGS. 15 and 16 can be considered to remove insulative material 136 from over layer 114, while leaving the insulative material 136 over the recessed substrate of isolation region 130.

Figure 17:
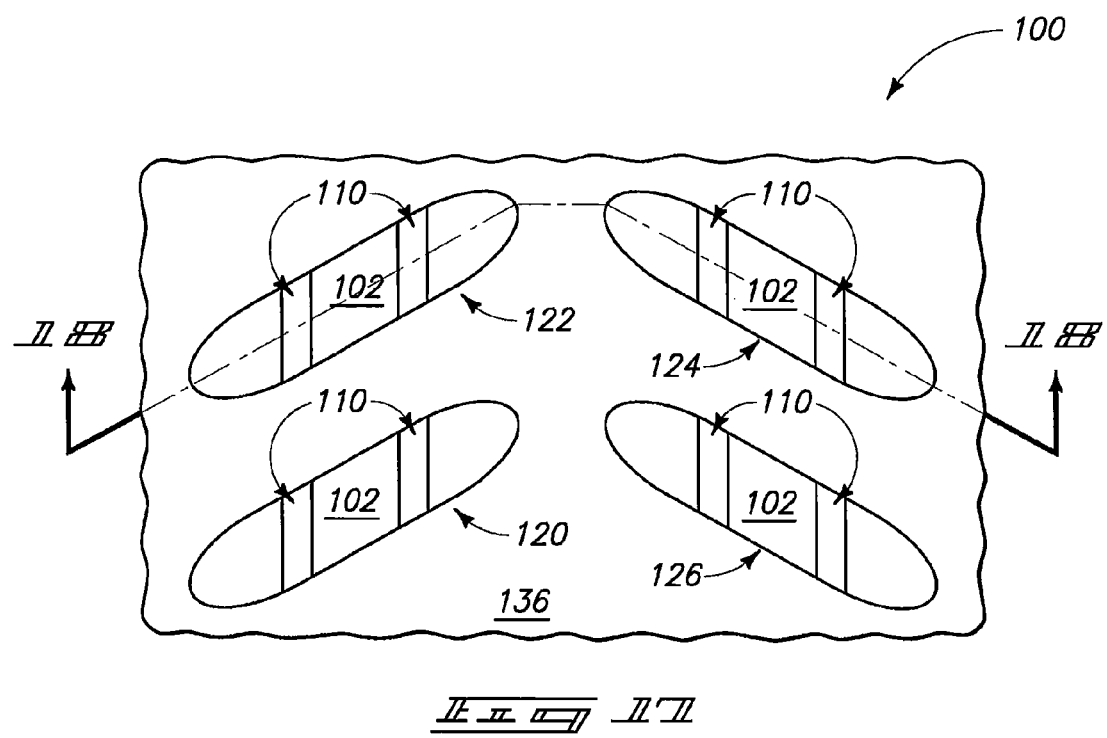
FIGS. 17 and 18 illustrate the fragments of FIGS. 3 and 4, respectively, at a processing stage subsequent to that of FIGS. 15 and 16. The cross-section of FIG. 18 is along the line 18-18 of FIG. 17.
Figure 18:
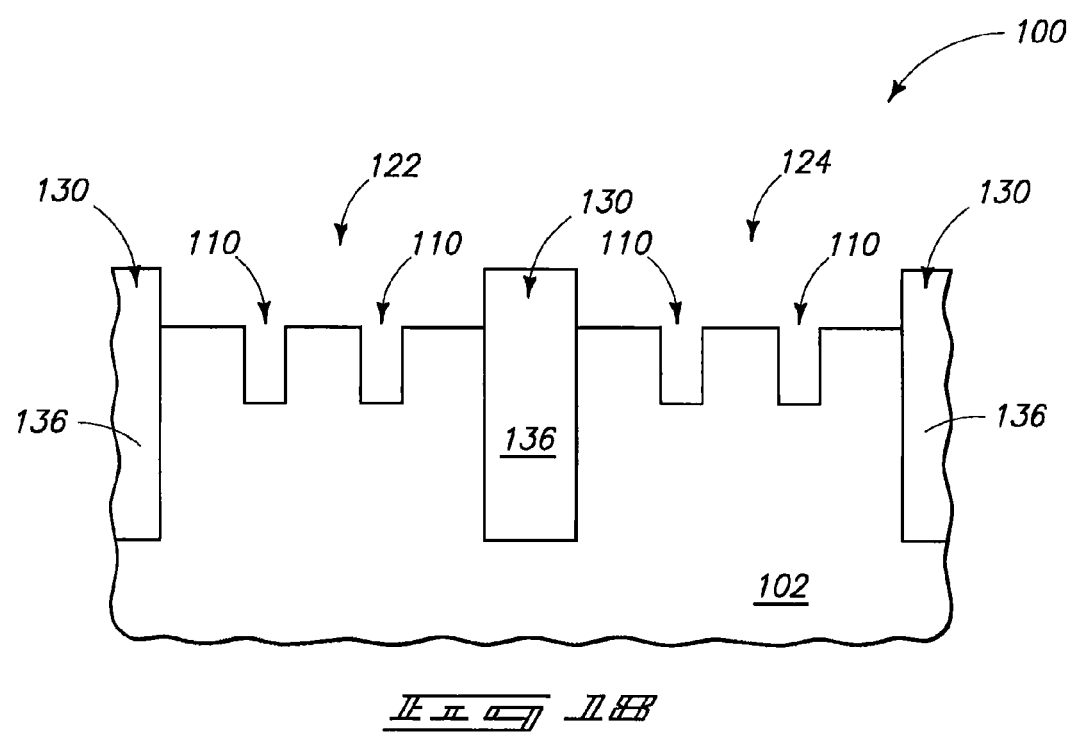

Referring next to FIGS. 17 and 18, layers 112 and 114 are removed from over substrate 102, while leaving the electrically insulative material 136. In some aspects, layers 112 and 114 can be together considered to comprise a first electrically insulative material, and it can be considered that at least the majority of such first electrically insulative material is removed while leaving at least a majority of a second electrically insulative material corresponding to the material 136. In the shown aspect, an entirety of the first electrically insulative material corresponding to layers 112 and 114 has been removed, but it is to be understood that the invention encompasses other aspects in which less than an entirety of such material is removed. For instance, if material 112 comprises silicon dioxide, the material 112 can be left to correspond to a gate oxide in subsequent processing. However, it can be advantageous if material 112 is removed, regardless of whether material 112 comprises silicon dioxide or not, in that such can allow a surface of substrate 102 to be cleaned prior to formation of the actual gate dielectric material. Accordingly, the material of layers 112 and 114 will typically correspond to sacrificial materials.

Dopant can be provided within substrate 102 at the processing stage of FIGS. 17 and 18 if it is desired to form dopant wells, such as, for example, p-wells or n-wells.

Referring next to FIGS. 19 and 20, gate dielectric material 140 is formed within recessed access device trenches 110, and subsequently conductive gate material 142 is formed over the gate dielectric material and within the trenches to fill the trenches. In the shown aspect of the invention, conductive gate material 142 comprises a first layer 144 and a second layer 146. The layers 144 and 146 join at an interface 147. Layer 144 can, for example, comprise, consist essentially of, or consist of conductively-doped silicon; and layer 146 can, for example, comprise, consist essentially of, or consist of one or more metal-containing compositions. The metal-containing compositions can be pure metal and/or metal-containing compounds. In particular aspects, layer 146 can comprise a stack of tungsten/tungsten silicide/titanium nitride, in descending order in the view of FIG. 20.

The shown gate material 142 not only fills the trenches 110, but also extends outside of such trenches. Further, the interface between the metal-containing compositions of layer 146 and the conductively-doped silicon of layer 144 (i.e., the interface 147) is outside of the trenches.

An electrically insulative cap 150 is formed over conductive gate material 142. Cap 150 can comprise any suitable composition or combination of compositions, and in particular aspects will comprise, consist essentially of, or consist of one or both silicon dioxide and silicon nitride.

The access device regions 120, 122, 124 and 126 are shown in dashed-line view in FIG. 19 to indicate that the regions are beneath insulative cap 150.

Referring next to FIGS. 21 and 22, materials 140, 144, 146 and 150 are patterned into conductive lines extending across access device regions 120, 122, 124 and 126. More specifically, the materials 140, 144, 146 and 150 are patterned into a plurality of lines 160, 162, 164 and 166, with each of the lines extending across multiple access device regions and electrically connecting gates associated with different access device regions with one another.

Source/drain regions 170, 172, 174, 176, 178 and 180 are formed within substrate 102 and proximate the electrically conductive gate material 144. The source/drain regions can be doped to any suitable dopant type, and can comprise any suitable dopants. The source/drain regions can be formed by implanting dopant into substrate 102 to an appropriate depth. The conductive gate material and source/drain regions together form a plurality of transistor devices 180, 182, 184 and 186 supported by substrate 102. Such transistor devices correspond to recessed access devices having gates extending within the recessed access device trenches 110.

Each of transistor devices 180, 182, 184 and 186 can be considered to comprise a gate electrically connecting a pair of source/drain regions with one another. For instance, transistor device 180 can be considered to comprise a gate electrically connecting source/drain regions 170 and 172 with one another; device 182 can be considered to comprise a gate electrically connecting source/drain regions 172 and 174 with one another; device 184 can be considered to comprise a gate electrically connecting source/drain regions 176 and 178 with one another; and device 186 can be considered to comprise a gate connecting source/drain regions 178 and 180 with one another.

The transistor devices can be incorporated into a dynamic random access memory (DRAM) array by connecting some of the paired source/drain regions to bitline contacts and others to storage node contacts (i.e. to capacitor storage nodes). In the shown aspect of the invention, source/drain regions 170, 174, 176 and 180 are connected to capacitor storage nodes 190, 192, 194 and 196, respectively; and source/drain regions 172 and 178 are connected to bitlines 198 and 200, respectively. Thus, the shown construction can be incorporated into a DRAM array.

Referring next to FIGS. 23 and 24, such illustrate a semiconductor construction 300 at a preliminary processing stage of a second embodiment aspect of the present invention. In referring to the drawings associated with the second aspect embodiment of the invention, similar numbering will be used as was used above in describing the first aspect embodiment of the invention, where appropriate.

Construction 300 comprises the substrate 102, patterned mask 104 of layers 106 and 108, and trenches 110 described previously with reference to FIGS. 3 and 4, and thus corresponds identically to the construction discussed above with reference to FIGS. 3 and 4.

Figure 25:
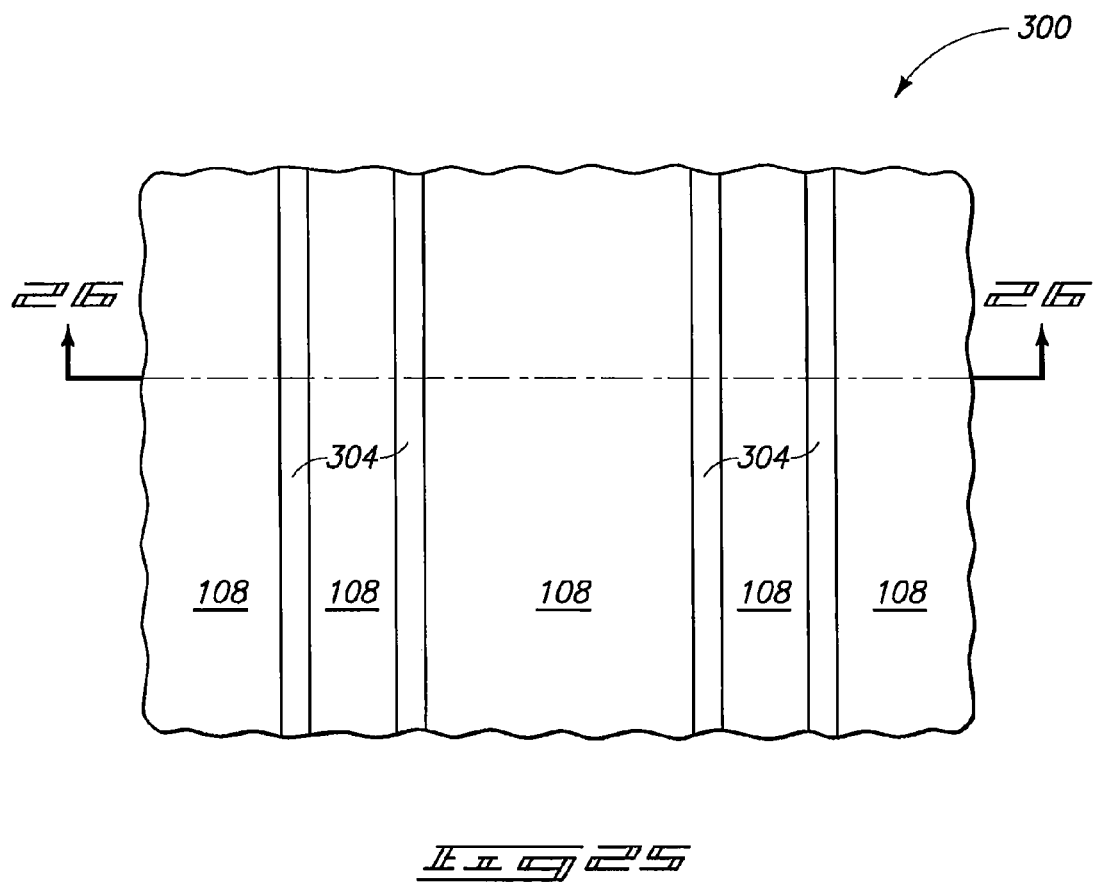
FIGS. 25 and 26 illustrate the fragments of FIGS. 23 and 24, respectively, at a processing stage subsequent to that of FIGS. 23 and 24. The cross-sectional view of FIG. 26 is along the line 26-26 of FIG. 25.
Figure 26:
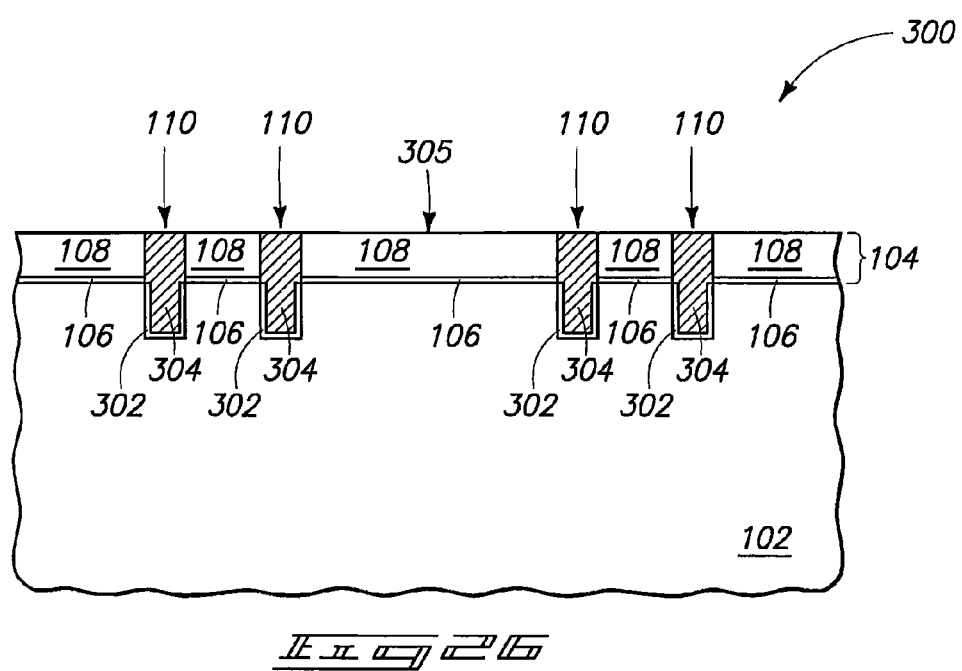

Referring next to FIGS. 25 and 26, gate dielectric material 302 is formed to line the bottom of trenches 110, and subsequently gate material 304 is formed within the trenches and over the dielectric material 302.

Dielectric material 302 can, for example, comprise, consist essentially of, or consist of silicon dioxide. In such aspect, material 302 can be deposited, or can be formed by oxidizing exposed silicon from substrate 102 within trenches 110. Dielectric material 302 can be formed in two steps, if so desired, with one of the steps being to initially form a first silicon dioxide material within trenches 110, and the other step being to strip the first dielectric material from within the trench and form another dielectric material within the trench which can be a better quality silicon dioxide dielectric than that initially provided.

Gate material 304 can comprise, consist essentially of, or consist of silicon. The silicon can be conductively-doped as-deposited, or can be deposited in an non-conductively-doped form and subsequently doped with an appropriate implant at a later processing stage.

The construction of FIG. 26 is shown to comprise a planarized upper surface 305 extending across gate material 304 and across insulative material 108. Such can be formed by initially providing gate material 304 to cover material 108 as well as to fill the trenches, and subsequently subjecting material 304 to planarization (such as, for example, chemical-mechanical polishing), to remove material 304 from over material 108 and form the planarized upper surface 305.

An enhancement implant and/or threshold voltage implant can be provided within substrate 102 prior to formation of gate material 304 within trenches 110, if desired.

Although gate material 304 is shown having a planarized surface coextensive with an uppermost surface of layer 108, it is to be understood that the gate material can also have a surface recessed below the elevational level of the uppermost surface of layer 108. In some aspects, it can be preferred that silicon-containing material 304 be recessed below the uppermost surface of layer 108.

Figure 27:
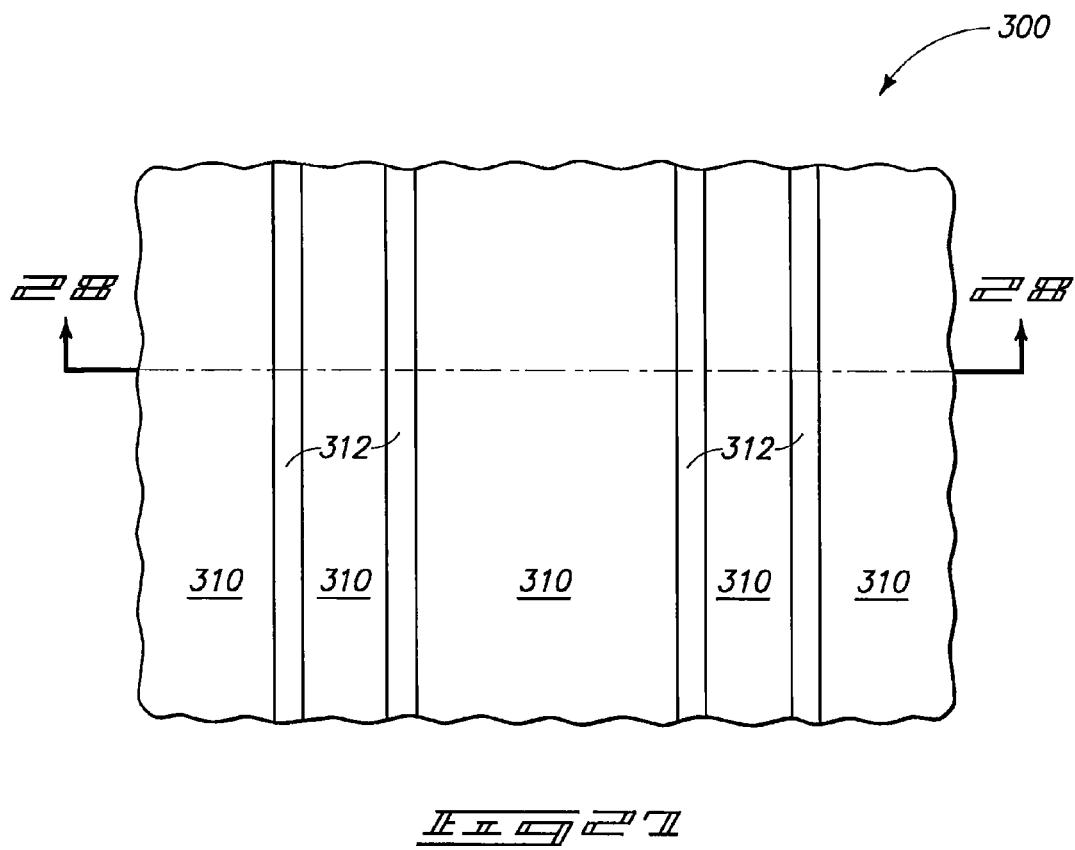
FIGS. 27 and 28 illustrate the fragments of FIGS. 23 and 24, respectively, at a processing stage subsequent to that of FIGS. 25 and 26. The cross-section of FIG. 28 is along the line 28-28 of FIG. 27.
Figure 28:
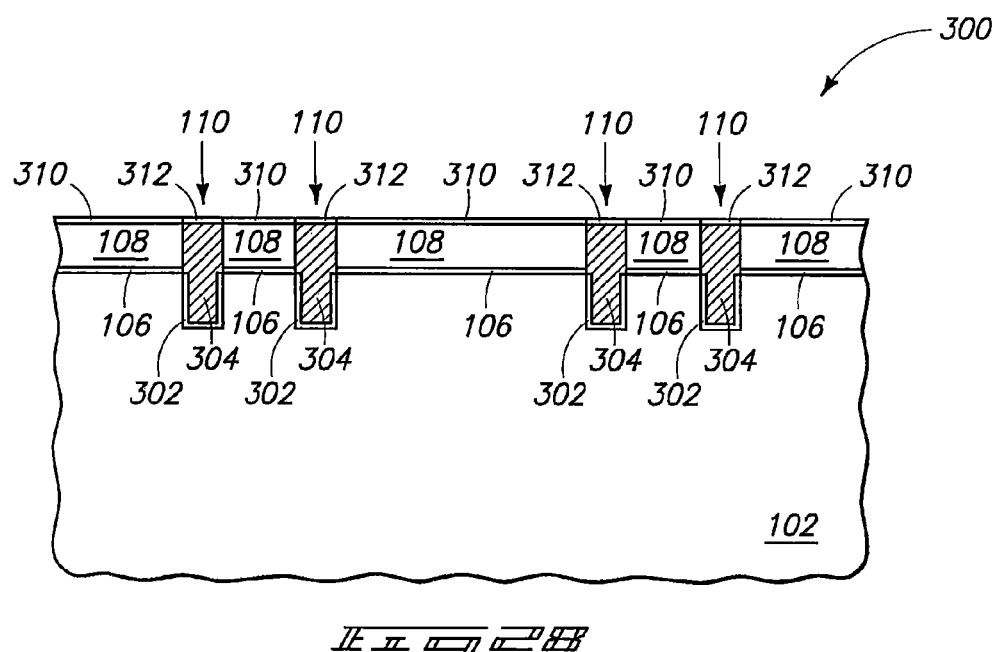

Referring next to FIGS. 27 and 28, uppermost surfaces of material 304 and layer 108 are subjected to oxidation to form an oxide 310 over layer 108, and an oxide 312 over layer 304. In particular aspects of the invention, layer 108 will comprise, consist essentially of, or consist of silicon nitride, and accordingly oxide 310 will comprise, consist essentially of, or consist of silicon oxynitride; and layer 304 will comprise, consist essentially of, or consist of silicon, and accordingly oxide 312 will comprise, consist essentially of, or consist of silicon dioxide. The oxides 310 and 312 can be formed to be from about 30 Å thick to about 60 Å thick.

Referring next to FIGS. 29 and 30, an electrically insulative material 314 is provided over oxides 310 and 312. Layer 314 can, for example, comprise, consist essentially of, or consist of silicon nitride, and can be deposited to a thickness of from about 300 Å to about 500 Å. In some aspects of the invention, the compositions 310, 312 and 314 can be together considered to form an insulative material 316 provided over the first patterned mask 104 and gate material 304.

Trenches 110 are shown in dashed-line view in FIG. 29 to indicate the locations of the trenches.

Figure 31I:
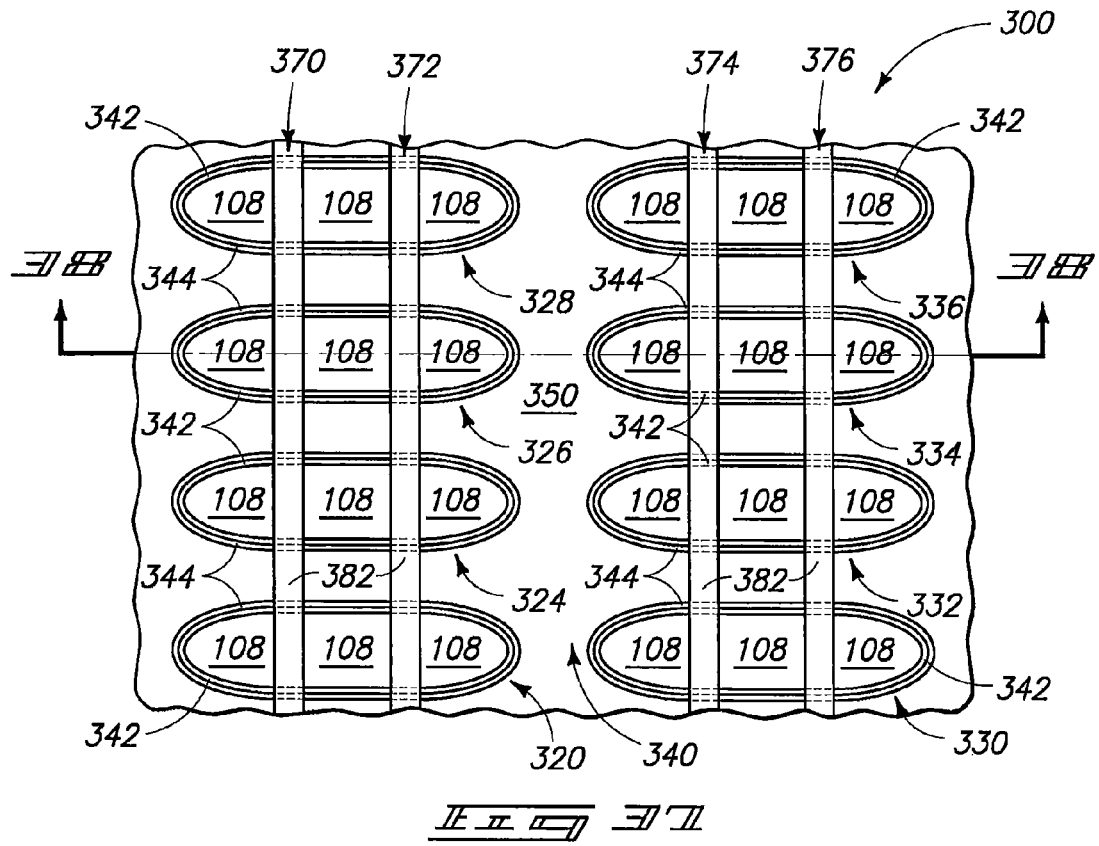
Figure 31J:
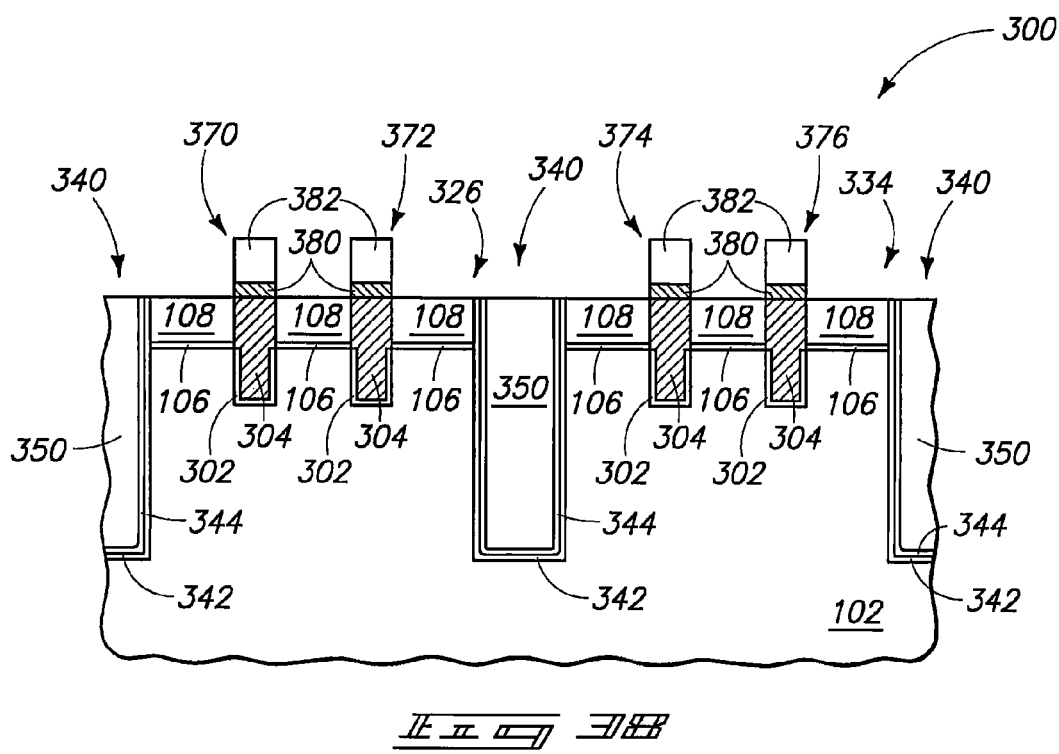

Referring next to FIGS. 31 and 32, material 316 is patterned into a mask defining a plurality of access device regions 320, 324, 326, 328, 330, 332, 334 and 336; and defining an isolation region 340 surrounding the access device regions. Patterning of material 316 can be accomplished by providing a photolithographically patterned photoresist mask (not shown) over material 316, transferring a pattern from the photoresist mask to material 316, and subsequently removing the photoresist mask.

After material 316 is patterned, substrate 102 is etched within isolation region 340 to recess the substrate of such isolation region. The recessed substrate of the isolation region is at an elevational level below the lowestmost elevational level of trenches 110, and in some aspects is at least two-fold deeper than the elevational level of trenches 110.

The etching within isolation region 340 removes gate material 304 from within the isolation region, while leaving the gate material within the access device regions 320, 324, 326, 328, 330, 332, 334 and 336. The etching within isolation region 340 can be accomplished with, for example, a reactive ion etch.

An oxide 342 and a nitride liner 344 are provided within the etched isolation region 340, and in the shown aspect also extend over material 314. Oxide 342 can, for example, comprise, consist essentially of, or consist of silicon dioxide along substrate 102; and nitride 344 can, for example, comprise, consist essentially of, or consist of silicon nitride. The oxide can be formed by oxidation of exposed materials of construction 300, and accordingly can comprise a different composition along substrate 102 than along materials 108 and 314; or alternatively can be formed by deposition. Oxidation can be preferred, in that such can repair plasma-induced damages that may have occurred during the reactive ion etch, and can also encroach into gate-dielectric at interfacial surfaces to provide low leakage between gate polysilicon and the bulk silicon of substrate 102. The oxide is preferably formed to a thickness of from about 30 Å to about 80 Å. The nitride liner 344 can be deposited over the oxide layer 342, and ultimately can function as a protective layer for a subsequent spin-on glass deposition process.

It is noted that the access device regions of FIG. 31 are shown to be elliptical similar to the access device regions of FIG. 9. However, unlike the access device regions of FIG. 9, the access device regions of FIG. 31 have primarily longitudinal elliptical axes which are substantially orthogonal to primary length axes of recessed access device trenches 110.

Figure 33:
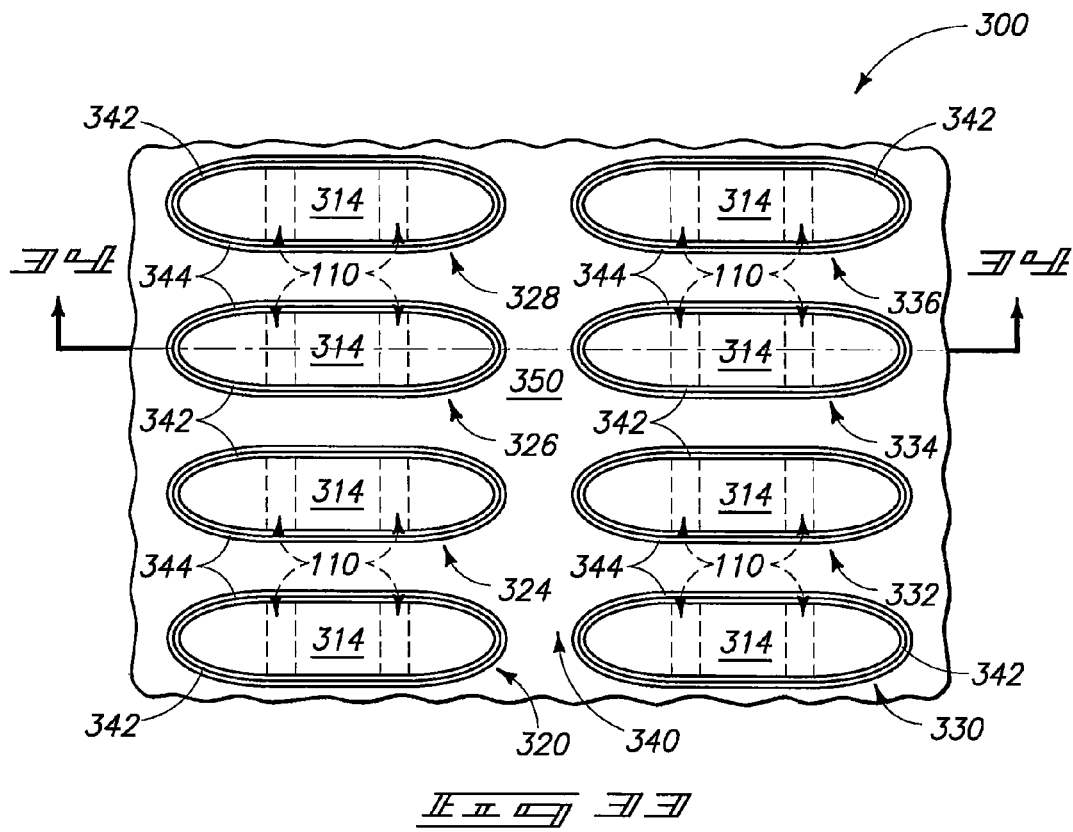
FIGS. 33 and 34 illustrate the fragments of FIGS. 23 and 24, respectively, at a processing stage subsequent to that of FIGS. 31 and 32. The cross-section of FIG. 34 is along the line 34-34 of FIG. 33.
Figure 34:
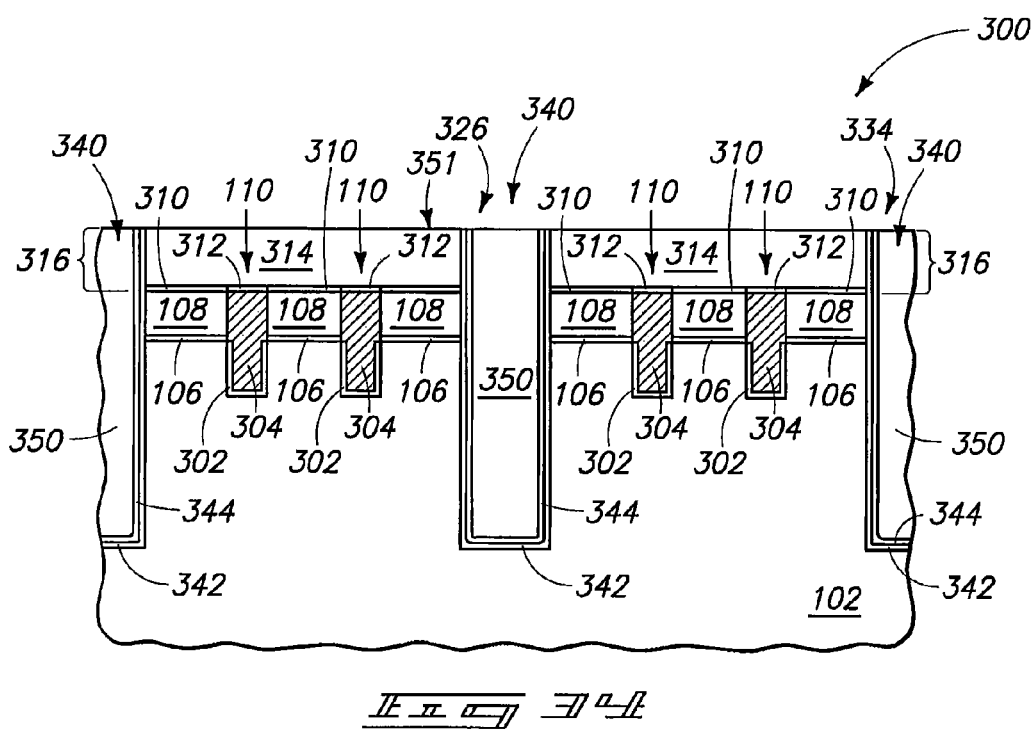

Referring next to FIGS. 33 and 34, dielectric material 350 is provided to fill recessed isolation region 340. Dielectric material 350 can be a spin-on glass. Dielectric material 350 can initially be formed to cover insulative material 316, as well as to fill recessed isolation region 340, and subsequently planarization (such as, for example, chemical-mechanical polishing) can be utilized to remove the dielectric material from over insulative material 316 and form the shown planarized surface 351 extending over dielectric material 350 and layer 314. In some aspects, insulative material 316 (comprising materials 314, 310 and 312) can be referred to as a first insulative material, and insulative material 350 can be referred to as a second insulative material.

Figure 35:
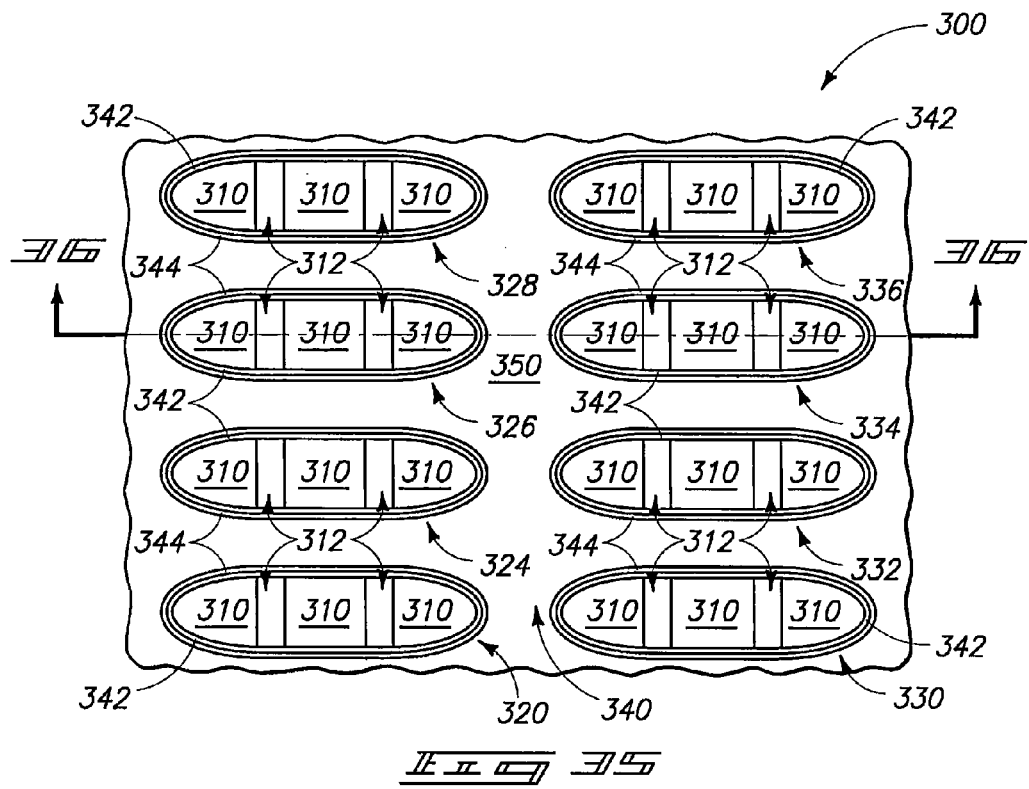
FIGS. 35 and 36 illustrate the fragments of FIGS. 23 and 24, respectively, at a processing stage subsequent to that of FIGS. 33 and 34. The cross-section of FIG. 36 is along the line 36-36 of FIG. 35.
Figure 36:
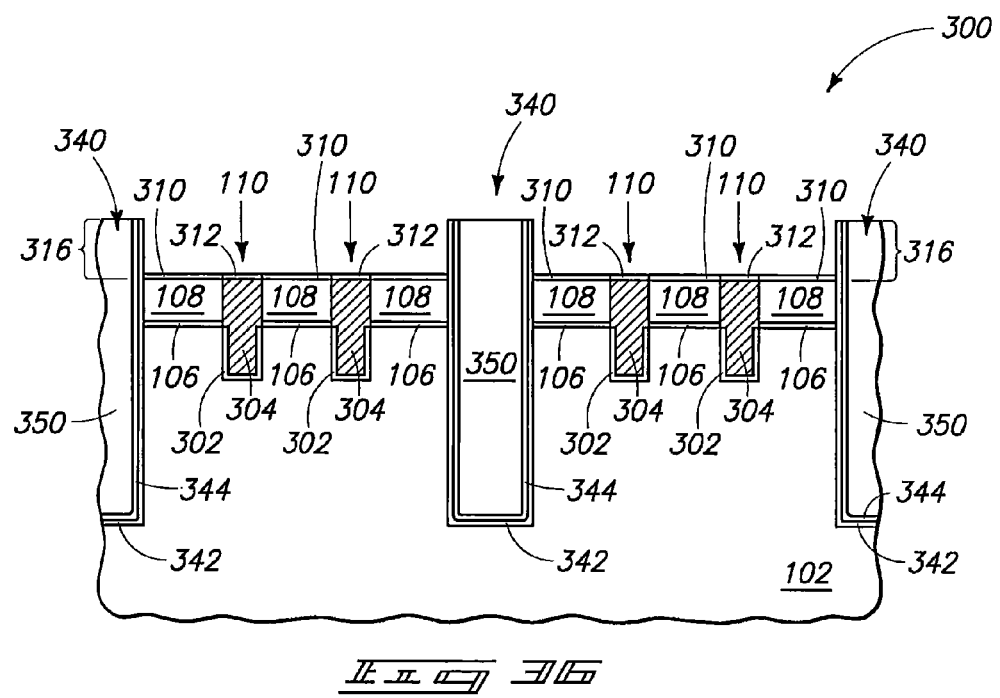

Referring next to FIGS. 35 and 36, layer 314 (FIG. 34) is removed. Such can be accomplished with a wet oxide etch to slightly recess the spin-on glass below the nitride of material 314, followed with a wet nitride strip to remove material 314. The wet nitride strip can selectively stop at the oxide materials 310 and 312.

Referring next to FIGS. 37 and 38, a plurality of lines 370, 372, 374 and 376 are formed to extend across access device regions 320, 324, 326, 328, 330, 332, 334 and 336. The lines comprise a conductive material 380 and an insulative cap 382. Conductive material 380 can comprise, for example, a stack of titanium nitride/tungsten silicide/tungsten (in ascending order in the view of FIG. 38), and cap 382 comprise, consist essentially of, or consist of silicon nitride.

The lines can be formed by initially depositing suitable materials of layers 380 and 382 entirely across the uppermost surface of construction 300, and subsequently patterning the materials by: forming photolithographically patterned photoresist over the layers 380 and 382, transferring a pattern from the photoresist to the underlying layers 380 and 382, and subsequently removing the photoresist.

The construction of FIGS. 37 and 38 can be incorporated into a DRAM array similarly to the construction of FIGS. 21 and 22. Specifically, appropriate conductively-doped diffusion regions can be formed proximate transistor gates comprised by conductive gate material 144, and capacitor constructions and bitline constructions can be electrically coupled with the source/drain regions.

Figure 39:
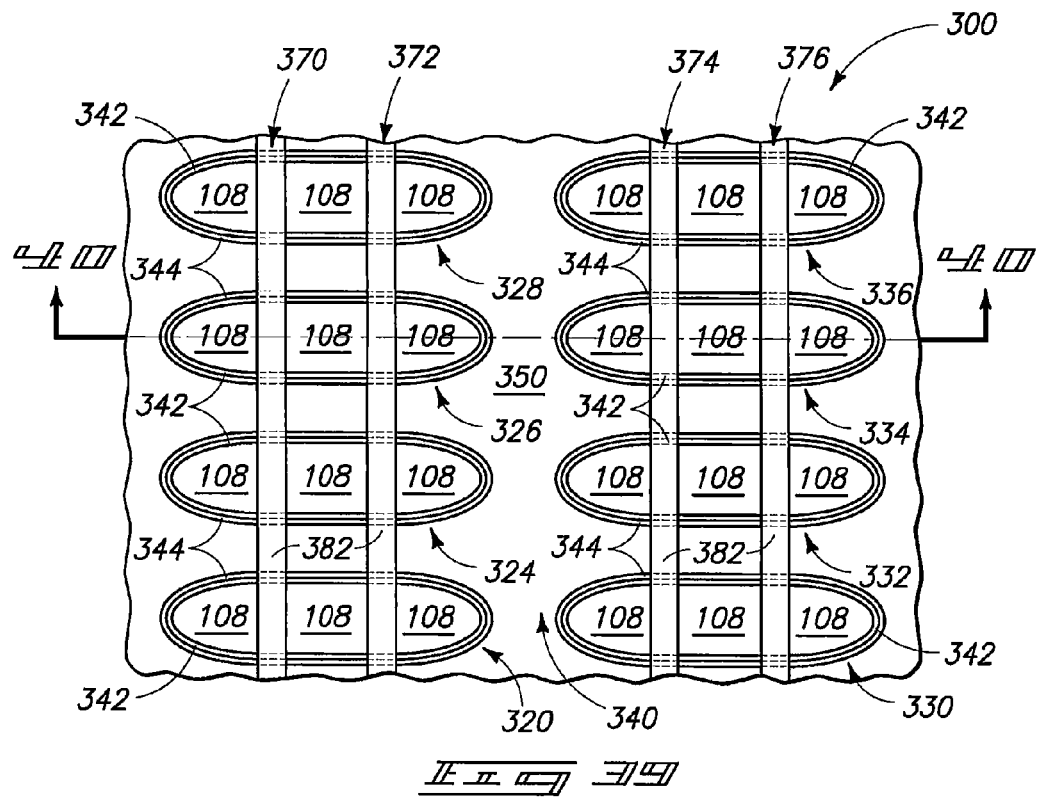
FIGS. 39 and 40 illustrate the fragments of FIGS. 23 and 24, respectively, at a processing stage subsequent to that of FIGS. 37 and 38. The cross-section of FIG. 40 is along the line 40-40 of FIG. 39.
Figure 40:
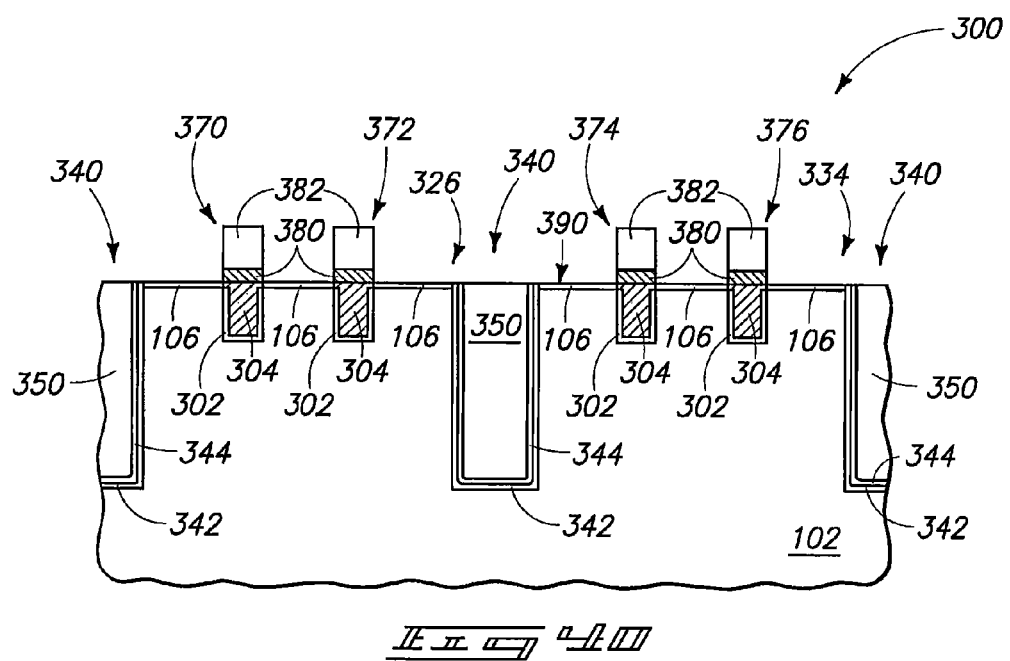

FIGS. 39 and 40 illustrate an alternative aspect relative to that of FIGS. 37 and 38. Specifically, construction 300 can be subjected to planarization prior to formation of lines 370, 372, 374 and 376. Such planarization removes layer 108 (FIGS. 35 and 36), and forms the shown planarized surface 390. Planarized surface 390 is shown on material 106, but it is to be understood that the planarization can also extend through material 106. If the planarization extends through material 106, another dielectric material can be formed over substrate 102 in place of the material 106 prior to formation of the lines. The construction of FIG. 40 can be incorporated into a memory array in a manner similar to that discussed above regarding the construction of FIG. 39.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A method of forming recessed access devices, comprising:
    forming recessed access device channels extending into a semiconductor substrate;
    filling the recessed access device channels with a first electrically insulative material;
    patterning the first electrically insulative material into a mask defining a plurality of access device regions, the access device regions being islands surrounded by an isolation region; the access device regions comprising only portions of the recessed access device channels;
    etching into the substrate of said isolation region to form a trench within the isolation region;
    after forming the trench, covering the substrate with an electrically insulative laminate comprising silicon dioxide over silicon nitride; the laminate filling the isolation region trench;
    removing the first electrically insulative material to reopen the recessed access device channels while leaving the electrically insulative laminate within the isolation region trench; and
    forming gate material within the re-opened recessed access device channels.

2. The method of claim 1 wherein the substrate comprises monocrystalline silicon, and wherein the recessed access device channels extend into the monocrystalline silicon of the substrate.

3. The method of claim 1 wherein the first electrically insulative material comprises a silicon nitride-containing layer over a silicon dioxide-containing layer.

4. The method of claim 1 wherein a bottom of the isolation region trench is below lowestmost levels of the recessed access device channels.

5. The method of claim 1 wherein the access device regions are substantially elliptical.

6. The method of claim 1 wherein the access device regions are substantially elliptical; wherein the substantially elliptical access device regions have primary longitudinal elliptical axes; wherein the recessed access device channels have primary length axes; and wherein the primary longitudinal elliptical axes of the substantially elliptical access device regions are substantially orthogonal to the primary length axes of the recessed access device channels.

7. The method of claim 1 wherein the access device regions are substantially elliptical; wherein the substantially elliptical access device regions have primary longitudinal elliptical axes; wherein the recessed access device channels have primary length axes; and wherein the primary longitudinal elliptical axes of the substantially elliptical access device regions are not substantially orthogonal to the primary length axes of the recessed access device channels.

8. A method of forming recessed access devices, comprising:
    forming recessed access device channels extending into a semiconductor material;
    filling the recessed access device channels with a gate material;
    forming a first electrically insulative material over the gate material and over the semiconductor material;
    patterning the first electrically insulative material into a mask defining a plurality of access device regions, the access device regions being islands surrounded by an isolation region; the access device regions comprising only portions of the recessed access device channels; the access device regions being substantially elliptical;

etching into the semiconductor material of said isolation region to form a trench extending into the isolation region, the etching also removing the gate material from between the access device regions;

filling the trenched isolation region with a second electrically insulative material;

removing the first electrically insulative material; and after removing the first electrically insulative material, forming a plurality of conductive lines, individual conductive lines extending across multiple access device regions and electrically interconnecting gate material of the multiple access device regions with one another.

9. The method of claim 8 wherein the semiconductor material is monocrystalline silicon.

10. The method of claim 8 wherein the substantially elliptical access device regions have primary longitudinal elliptical axes; wherein the recessed access device channels have primary length axes; and wherein the primary longitudinal elliptical axes of the substantially elliptical access device regions are substantially orthogonol to the primary length axes of the recessed access device channels.

11. The method of claim 8 wherein the substantially elliptical access device regions have primary longitudinal elliptical axes; wherein the recessed access device channels have primary length axes; and wherein the primary longitudinal elliptical axes of the substantially elliptical access device regions are not substantially orthogonal to the primary length axes of the recessed access device channels.

12. The method of claim 8 whwerein:

the semiconductor material is monocrystalline silicon;

the recessed access device channels are formed to a first depth in the monocrystalline silicon; and the isolation region trench is formed to a second depth in the monocrystalline silicon, with the second depth being at least two-fold greater than the first depth.

13. The method of claim 8 wherein the second electrically insulative material comprises silicon dioxide.

14. The method of claim 13 wherein the second electrically insulative material comprises a liner of silicon nitride between the silicon dioxide and the semiconductor material.

* * * * *

UNITED STATES PATENT AND TRADEMARK OFFICE
CERTIFICATE OF CORRECTION

| | |
|---|---|
| PATENT NO. | : 8,067,286 B2 |
| APPLICATION NO. | : 13/012675 |
| DATED | : November 29, 2011 |
| INVENTOR(S) | : Kunal R. Parekh et al. |

It is certified that error appears in the above-identified patent and that said Letters Patent is hereby corrected as shown below:

In column 13, line 20, in Claim 10, delete "orthogonol" and insert -- orthogonal --, therefor.

In column 14, line 8, in Claim 12, delete "whwerein:" and insert -- wherein: --, therefor.

Signed and Sealed this
Fourteenth Day of February, 2012

David J. Kappos
*Director of the United States Patent and Trademark Office*